(12) United States Patent
Bhagavat et al.

(10) Patent No.: US 8,712,575 B2
(45) Date of Patent: Apr. 29, 2014

(54) HYDROSTATIC PAD PRESSURE MODULATION IN A SIMULTANEOUS DOUBLE SIDE WAFER GRINDER

(75) Inventors: Sumeet S. Bhagavat, St. Peters, MO (US); Roland R. Vandamme, Wentzville, MO (US); Tomomi Komura, Tochigi (JP)

(73) Assignee: MEMC Electronic Materials, Inc., St. Peters, MO (US)

( * ) Notice: Subject to any disclaimer, the term of this patent is extended or adjusted under 35 U.S.C. 154(b) by 369 days.

(21) Appl. No.: 13/049,536

(22) Filed: Mar. 16, 2011

(65) Prior Publication Data

US 2011/0237160 A1    Sep. 29, 2011

Related U.S. Application Data

(60) Provisional application No. 61/317,919, filed on Mar. 26, 2010.

(51) Int. Cl.
*B24B 1/00* (2006.01)
*H01L 21/00* (2006.01)
*B24B 9/14* (2006.01)
*H01L 21/78* (2006.01)
*B24B 37/04* (2012.01)

(52) U.S. Cl.
CPC .............. *B24B 9/148* (2013.01); *H01L 21/78* (2013.01); *B24B 37/042* (2013.01)
USPC ........... 700/174; 700/164; 438/462; 438/113; 451/41; 451/57

(58) Field of Classification Search
USPC ................................. 700/174, 164
See application file for complete search history.

(56) References Cited

U.S. PATENT DOCUMENTS

| | | | | |
|---|---|---|---|---|
| 6,066,565 A * | 5/2000 | Kuroki et al. | ................. | 438/692 |
| 6,284,658 B1 * | 9/2001 | Kato et al. | .................... | 438/690 |
| 6,294,469 B1 * | 9/2001 | Kulkarni et al. | ............. | 438/689 |
| 6,491,836 B1 * | 12/2002 | Kato et al. | ....................... | 216/88 |
| 6,652,358 B1 * | 11/2003 | Ikeda et al. | ....................... | 451/8 |
| 7,040,958 B2 | 5/2006 | Gan et al. | | |
| 7,068,350 B2 * | 6/2006 | Nishi et al. | ...................... | 355/53 |
| 7,150,674 B2 | 12/2006 | Okura | | |
| 7,601,049 B2 * | 10/2009 | Bhagavat et al. | ................. | 451/9 |
| 7,662,023 B2 * | 2/2010 | Vandamme et al. | ............. | 451/9 |
| 7,666,064 B2 * | 2/2010 | Junge et al. | ....................... | 451/7 |

(Continued)

OTHER PUBLICATIONS

Liu, J.H.; Pei, Z.J.; Fisher, G.R., "Grinding Wheels for Manufacturing of Silicon Wafers: A Literature Review", Jan. 2006, International Journal of Machine Tools and Manufacturing, Iss. 47, pp. 1-13.*

(Continued)

*Primary Examiner* — Mohammad Ali
*Assistant Examiner* — Kelvin Booker
(74) *Attorney, Agent, or Firm* — Armstrong Teasdale LLP

(57) ABSTRACT

Systems and methods are disclosed for modulating the hydrostatic pressure in a double side wafer grinder having a pair of grinding wheels. The systems and methods use a processor to measure the amount of electrical current drawn by the grinding wheels. Pattern detection software is used to predict a grinding stage based on the measured electrical current. The hydrostatic pressure is changed by flow control valves at each stage to change the clamping pressure applied to the wafer and to thereby improve nanotopology in the processed wafer.

10 Claims, 38 Drawing Sheets

(56) References Cited

U.S. PATENT DOCUMENTS

| | | | |
|---|---|---|---|
| 7,867,059 B2* | 1/2011 | Pietsch et al. | 451/11 |
| 7,887,394 B2* | 2/2011 | Oishi et al. | 451/63 |
| 7,927,185 B2* | 4/2011 | Vandamme et al. | 451/9 |
| 7,930,058 B2* | 4/2011 | Bhagavat et al. | 700/164 |
| 7,964,432 B2* | 6/2011 | Dunne et al. | 438/69 |
| 7,989,319 B2* | 8/2011 | Grivna et al. | 438/462 |
| 8,012,857 B2* | 9/2011 | Grivna et al. | 438/462 |
| 8,066,553 B2* | 11/2011 | Bhagavat et al. | 451/364 |
| 8,145,342 B2* | 3/2012 | Bhagavat et al. | 700/121 |
| 8,267,745 B2* | 9/2012 | Bhagavat et al. | 451/41 |
| 2005/0024610 A1* | 2/2005 | Nishi et al. | 355/53 |
| 2005/0173377 A1* | 8/2005 | Pietsch et al. | 216/88 |
| 2005/0260922 A1 | 11/2005 | Gan et al. | |
| 2007/0179659 A1* | 8/2007 | Vandamme et al. | 700/164 |
| 2007/0179660 A1* | 8/2007 | Bhagavat et al. | 700/164 |
| 2007/0291156 A1* | 12/2007 | Dunne et al. | 348/340 |
| 2008/0020684 A1* | 1/2008 | Bhagavat et al. | 451/365 |
| 2008/0166948 A1* | 7/2008 | Bhagavat et al. | 451/5 |
| 2009/0011683 A1* | 1/2009 | Junge et al. | 451/57 |
| 2009/0104852 A1 | 4/2009 | Pietsch et al. | |
| 2009/0203297 A1* | 8/2009 | Pietsch et al. | 451/57 |
| 2010/0087123 A1* | 4/2010 | Vandamme et al. | 451/5 |
| 2010/0120227 A1* | 5/2010 | Grivna et al. | 438/462 |
| 2010/0120230 A1* | 5/2010 | Grivna et al. | 438/464 |
| 2011/0045740 A1* | 2/2011 | Bhagavat et al. | 451/5 |
| 2011/0081836 A1* | 4/2011 | Schwandner | 451/41 |
| 2011/0101504 A1* | 5/2011 | Bhagavat et al. | 257/618 |
| 2011/0244657 A1* | 10/2011 | Grivna et al. | 438/462 |
| 2011/0304548 A1* | 12/2011 | Yoshida | 345/166 |
| 2012/0244681 A1* | 9/2012 | Grivna et al. | 438/462 |

OTHER PUBLICATIONS

Pei, Z.J.; Fisher, G.R.; Bhagavat, M. and Kassir, S., "A Grinding-Based Manufacturing Method for Silicon Wafers: An Experimental Investigation", Oct. 2004, International Journal of Machine Tools and Manufacture, Iss. 45, pp. 1140-1151.*

Li, Z C.; Pei, Z.J.; and Fisher, G.R., "Simultaneous Double Side Grinding of Silicon Wafers: A Literature Review", 2006, International Journal of Machine Tools and Manufacture, vol. 46, No. 12-13, pp. 1449-1458.*

Lieberenz, T. and Martin, D., "Dicing Before Grinding for Wafer Thinning", May-Jun. 2006, Chip Scale Review Magazine, Retrieved from the Internet at "www.chipscalereview.com".*

Liu, J.H.; Pei, Z.J. and Fisher, G.R., "ELID Grinding of Silicon Wafers: A Literature Review", 2007, International Journal of Machine Tools and Manufacture, vol. 47, No. 3-4, pp. 529-536.*

Rahman, M.; Senthil, A.; Lim, H.S. and Fatima, K., "Nano Finish Grinding of Brittle Materials Using Electrolytic In-Process Dressing (ELID) Technique", Oct. 2003, Sadhana, vol. 28, Part 5, pp. 957-974.*

Pei, Z.J.; Fisher, G.R. and Liu, J., "Grinding of Silicon Wafers: A Review From Historical Perspectives", 2008, International Journal of Machine Tools and Manufacture, vol. 48, No. 12-13, pp. 1297-1307.*

Qin, N.; Pei, Z.J.; Fisher, G.R. and Liu, J., "Simultaneous Double Side Grinding of Silicon Wafers: A Review and Analysis of Experimental Investigations", 2009, Machining Science and Technology, vol. 13, pp. 285-316.*

Schellekens, P. and Rosielle, N., "Design for Precision: Current Status and Trends", 1998, Annals of The CIRP, vol. 47, pp. 557-586.*

Pietsch, G.J. and Kerstan, M., "Understanding Simultaneous Double-Disk Grinding: Operation Principle and Material Removal Kinematics in Silicon Wafer Planarization", Dec. 2002, Precision Engineering, vol. 29, pp. 189-196.*

International Search Report and Written Opinion of the International Searching Authority regarding PCT/IB2011/51152 filed on Mar. 18, 2011 mailed on Aug. 3, 2011; 14 pages.

* cited by examiner

<u>PRIOR ART</u>

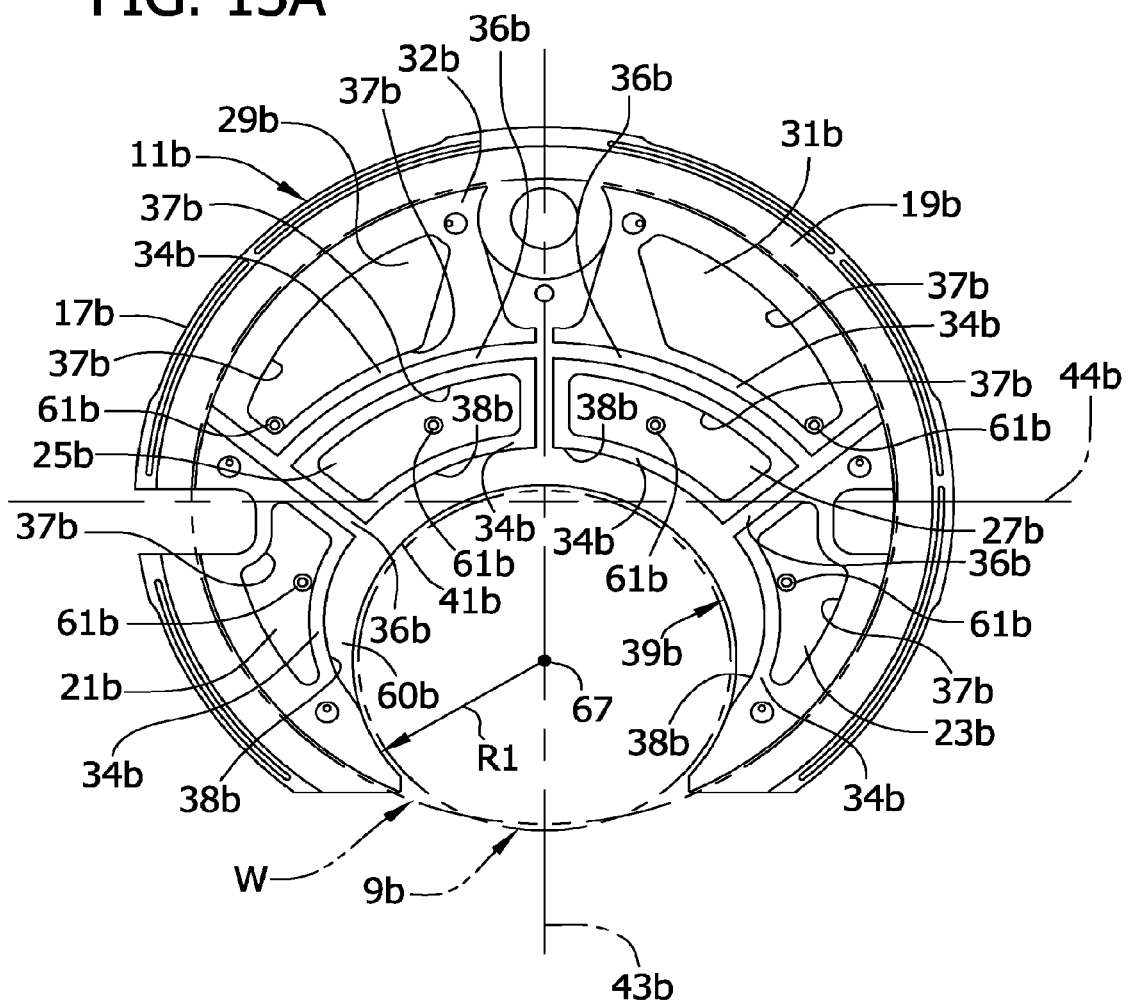

HYDROSTATIC PAD PRESSURE MODULATION IN A SIMULTANEOUS DOUBLE SIDE WAFER GRINDER

CROSS-REFERENCE TO RELATED APPLICATION

This application claims priority to U.S. Provisional Patent Application No. 61/317,919 filed Mar. 26, 2010, the entire disclosure of which is hereby incorporated by reference in its entirety.

FIELD

This disclosure relates generally to simultaneous double side grinding of semiconductor wafers and more particularly to double side grinding apparatus and methods for improved wafer nanotopology.

BACKGROUND

Semiconductor wafers are commonly used in the production of integrated circuit (IC) chips on which circuitry is printed. The circuitry is first printed in miniaturized form onto surfaces of the wafers, then the wafers are broken into circuit chips. But this smaller circuitry requires that wafer surfaces be extremely flat and parallel to ensure that the circuitry can be properly printed over the entire surface of the wafer. To accomplish this, a grinding process is commonly used to improve certain features of the wafers (e.g., flatness and parallelism) after they are cut from an ingot.

Simultaneous double side grinding operates on both sides of the wafer at the same time and produces wafers with highly planarized surfaces. It is therefore a desirable grinding process. Double side grinders that can be used to accomplish this include those manufactured by Koyo Machine Industries Co., Ltd. These grinders use a wafer-clamping device to hold the semiconductor wafer during grinding. The clamping device typically comprises a pair of hydrostatic pads and a pair of grinding wheels. The pads and wheels are oriented in opposed relation to hold the wafer therebetween in a vertical orientation. The hydrostatic pads beneficially produce a fluid barrier between the respective pad and wafer surface for holding the wafer without the rigid pads physically contacting the wafer during grinding. This reduces damage to the wafer that may be caused by physical clamping and allows the wafer to move (rotate) tangentially relative to the pad surfaces with less friction. While this grinding process significantly improves flatness and parallelism of the ground wafer surfaces, it can also cause degradation of the topology and nanotopology (NT) of the wafer surfaces.

Poor nanotopology leads to non-uniform oxide layer removal in a later polishing (CMP) process. This can lead to substantial yield losses for the wafer users such as IC manufacturers. As the IC manufacturers move towards 22 nanometer process technology, the tolerances for nanotopology are projected to become tighter.

In order to identify and address the topology degradation concerns, device and semiconductor material manufacturers consider the nanotopology of the wafer surfaces. Nanotopology has been defined as the deviation of a wafer surface within a spatial wavelength of about 0.2 mm to about 20 mm. This spatial wavelength corresponds very closely to surface features on the nanometer scale for processed semiconductor wafers. The foregoing definition has been proposed by Semiconductor Equipment and Materials International (SEMI), a global trade association for the semiconductor industry (SEMI document 3089). Nanotopology measures the elevational deviations of one surface of the wafer and does not consider thickness variations of the wafer, as with traditional flatness measurements. Several metrology methods have been developed to detect and record these kinds of surface variations. For instance, the measurement deviation of reflected light from incident light allows detection of very small surface variations. These methods are used to measure peak to valley (PV) variations within the wavelength.

Double sided grinding is one process which governs the nanotopology (NT) of finished wafers. NT defects like C-Marks (PV value generally within a radius of 0 to 50 mm of center) and B-Rings (PV value generally within a radius of 100 to 150 mm of center) take form during grinding process and may lead to substantial yield losses. These are two defects which lead to substantial yield losses due to NT. A third defect which leads to losses due to NT is the entrance mark produced on the wafer during wiresaw slicing. Double sided grinding can potentially reduce the entrance mark if the grinding wheels are favorably oriented with respect to the wafer. In the current practice, warp and TTV of the wafer are measured immediately after grinding using a capacitance tool like Kobelco SBW 330, then the wafer is etched and is measured using a laser based tool such as Wafercom. After this, the wafer undergoes various downstream processes like edge polishing, double sided polishing, and final polishing as well as measurements for flatness and edge defects before the NT is checked by a nanomapper.

The current methods of controlling NT try to solve the problem by making adjustments to the grinder, but these solutions do not satisfactorily address the causes of NT degradation. At least one cause of NT degradation is thought to be the clamping state dictated by the interaction between the hydrostatic profile of the pads and the incoming wafer.

After a wafer is loaded into the grinder, it is clamped by the hydrostatic pressure generated by the pads on opposite sides of the wafer. The wafer may be elastically deformed in an initial clamping state based on the interaction between the shape of the incoming wafer and the hydrostatic pressure profile of the hydrostatic pads. After the wheel starts contacting the wafer, there is a period of time where the wheel attempts to grip the wafer without removing a significant amount of material. During this period of time the wafer undergoes further elastic deformation depending on the interaction between tilts and shifts of the wheel and the initial clamping state. The wheels begin grinding the wafer and material is removed from the wafer once a stable state is reached. As the material is being removed in the stable state the NT of the wafer is thought to be a function of the geometric interaction between the wheel and the stable state of the wafer.

After a set amount of material has been removed, the wheels retract and the elastic deformation of the wafer is reversed. The reversal of the elastic deformation after retractions of the wheels further degrades NT. The combined effects of the two contributors to NT degradation—geometric interaction between the wheel and the stable state of the wafer and reversal of the elastic deformation—are difficult to control. Previous approaches have yielded unsatisfactory results in controlling the NT degradation resultant from the elastic deformation of the wafer.

A typical wafer-clamping device 1' of a double side grinder of the prior art is schematically shown in FIGS. 1 and 2. Grinding wheels 9' and hydrostatic pads 11' hold the wafer W independently of one another. They respectively define clamping planes 71' and 73'. A clamping pressure of the grinding wheels 9' on the wafer W is centered at a rotational axis 67' of the wheels, while a clamping pressure of the hydrostatic pads 11' on the wafer is centered near a center WC of the wafer. As long as clamping planes 71' and 73' are held coincident during grinding (FIG. 1), the wafer remains in plane (i.e., does not bend) and is uniformly ground by wheels 9'. A general discussion regarding alignment of clamping planes may be found in U.S. Pat. No. 6,652,358. However, if the two planes 71' and 73' become misaligned, the clamping pressures of the grinding wheels 9' and hydrostatic pads 11' produce a bending moment, or hydrostatic clamping moment, in the wafer W that causes the wafer to bend sharply generally adjacent peripheral edges 41' of the grinding wheel openings 39' (FIG. 2). This produces regions of high localized stress in the wafer W.

Misalignment of clamping planes 71' and 73' is common during double side grinding operation and is generally caused by movement of the grinding wheels 9' relative to the hydrostatic pads 11' (FIG. 2). Possible modes of misalignment are schematically illustrated in FIGS. 2 and 3. These include a combination of three distinct modes. In the first mode there is a lateral shift S of the grinding wheels 9' relative to the hydrostatic pads 11' in translation along an axis of rotation 67' of the grinding wheels (FIG. 2). A second mode is characterized by a vertical tilt VT of the wheels 9' about a horizontal axis X through the center of the respective grinding wheel (FIGS. 2 and 3). FIG. 2 illustrates a combination of the first mode and second mode. In a third mode there is a horizontal tilt HT of the wheels 9' about a vertical axis Y through the center of the respective grinding wheel (FIG. 3). These modes are greatly exaggerated in the drawings to illustrate the concept; actual misalignment may be relatively small. In addition, each of the wheels 9' is capable of moving independently of the other so that horizontal tilt HT of the left wheel can be different from that of the right wheel, and the same is true for the vertical tilts VT of the two wheels.

The magnitude of hydrostatic clamping moments caused by misalignment of clamping planes 71' and 73' is related to the design of the hydrostatic pads 11'. For example, higher moments are generally caused by pads 11' that clamp a larger area of the wafer W (e.g., pads that have a large working surface area), by pads in which a center of pad clamping is located a relatively large distance apart from the grinding wheel rotational axis 67', by pads that exert a high hydrostatic pad clamping force on the wafer (i.e., hold the wafer very rigidly), or by pads that exhibit a combination of these features.

In clamping device 1' using prior art pads 11' (an example of one prior art pad is shown in FIG. 4), the bending moment in wafer W is relatively large when clamping planes 71' and 73' misalign because the wafer is clamped very tightly and rigidly by the pads 11', including near peripheral edges 41' of grinding wheel opening 39'. The wafer cannot adjust to movement of grinding wheels 9' and the wafer bends sharply near opening edges 41' (FIG. 2). The wafers W are not uniformly ground and they develop undesirable nanotopology features that cannot be removed by subsequent processing (e.g., polishing). Misalignment of clamping planes 71' and 73' can also cause the grinding wheels 9' to wear unevenly, which can further contribute to development of undesirable nanotopology features on the ground wafer W.

FIGS. 5A and 5B illustrate undesirable nanotopology features that can form on surfaces of a ground wafer W when clamping planes 71' and 73' misalign and the wafer bends during the grinding operation. The features include centermarks (C-marks) 77' and B-rings 79' (FIG. 5A). The centermarks (C-marks) 77' are generally caused by a combination of lateral shift S and vertical tilt VT of the grinding wheels 9', while the B-rings 79' are generally caused by a combination of lateral shift S and horizontal tilt HT of the wheels. As shown in FIG. 5B, both features 77' and 79' have relatively large peak to valley variations associated with them. They are therefore indicative of poor wafer nanotopology and can significantly affect ability to print miniaturized circuitry on wafer surfaces.

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

SUMMARY

One aspect is a method of processing a semiconductor wafer using a double side grinder of the type that holds the wafer between a pair of grinding wheels and a pair of hydrostatic pads having a hydrostatic pressure therein. The grinder includes a processor including pattern detection software to detect current drawn by the grinding wheels. The method comprises a plurality of stages include clamping the wafer, grinding the wafer, and removing the wafer from contact with the grinding wheels. The method also comprises using the software to detect each stage and changing the hydrostatic pressure at each stage to change the clamping pressure applied to the wafer to thereby improve nanotopology in the processed wafer.

Another aspect is a method of processing a semiconductor wafer using a double side grinder of the type that holds the wafer between a pair of grinding wheels and a pair of hydrostatic pads during a grinding operation. The method includes establishing a first hydrostatic pressure in the hydrostatic pads to initially clamp the wafer during a first stage of the grinding operation. The hydrostatic pressure is reduced to a second hydrostatic pressure lower than the first pressure during grinding of the wafer in a second stage of the grinding operation. The hydrostatic pressure is increased to a third pressure to clamp the wafer during a third stage of the grinding operation and to thereby improve nanotopology in the processed wafer.

Still another aspect is a double side grinder comprising a pair of grinding wheels, a processor, and a pair of hydrostatic pads. The grinding wheels and hydrostatic pads are operable to hold a generally flat wafer in a plane with a first part of the wafer positioned between the grinding wheels and a second part of the positioned between the hydrostatic pads. The hydrostatic pads include water flowing therethrough to maintain a hydrostatic pressure. The grinder further comprises flow control valves for controlling the water flow rate through the pads and to thereby control the hydrostatic pressure. The flow control valves are controlled by the processor.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIG. 13A is an elevation similar to FIG. 9A of the right hydrostatic pad;

FIG. 25A is a mesh that is suitable for finite element structural analysis of a wafer;

Corresponding reference characters indicate corresponding parts throughout the several views of the drawings.

DETAILED DESCRIPTION OF THE INVENTION

Figure 6:
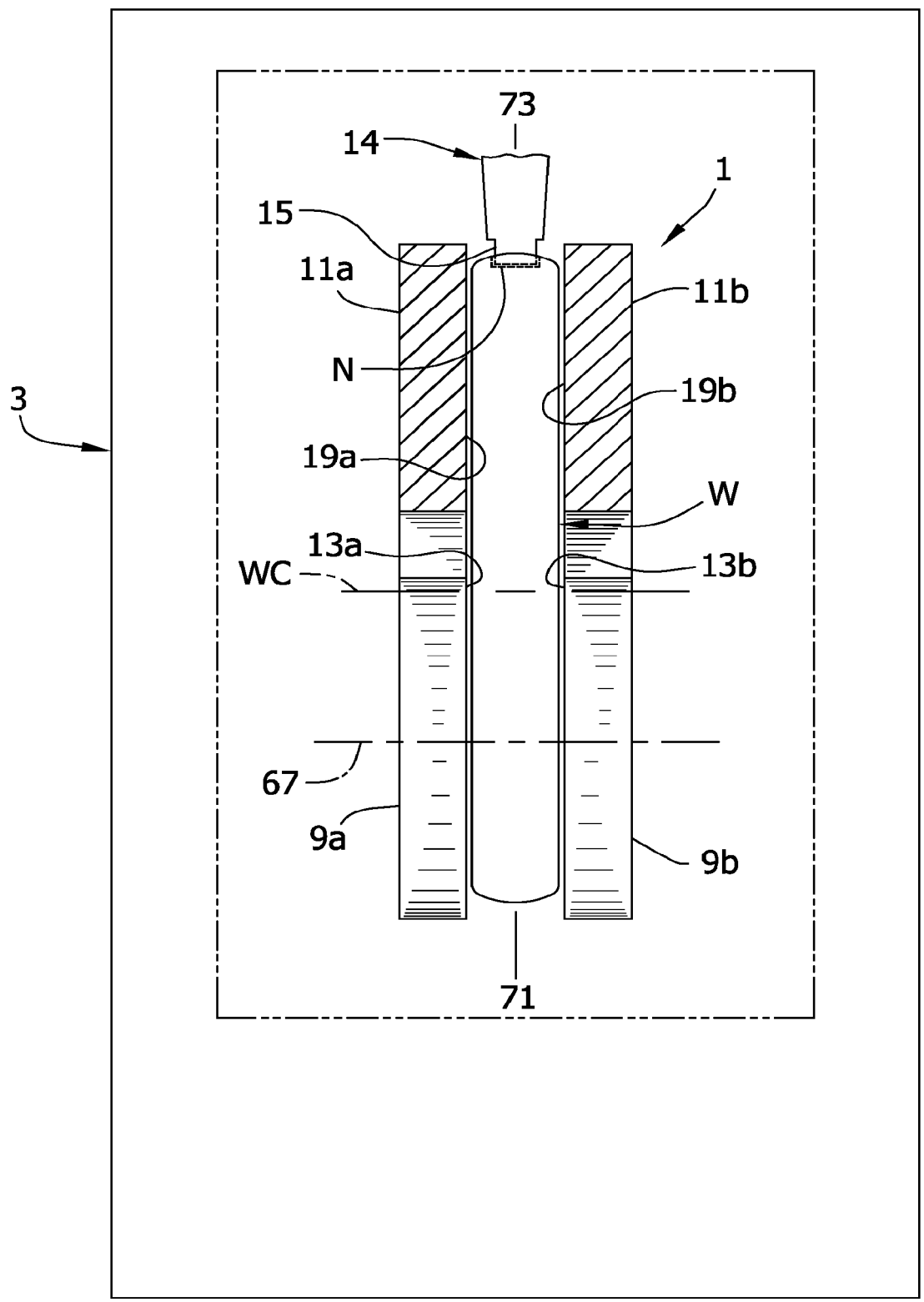
FIG. 6 is a schematic side elevation of a grinder incorporating a wafer-clamping device of the present invention with hydrostatic pads shown in section.
Figure 7:
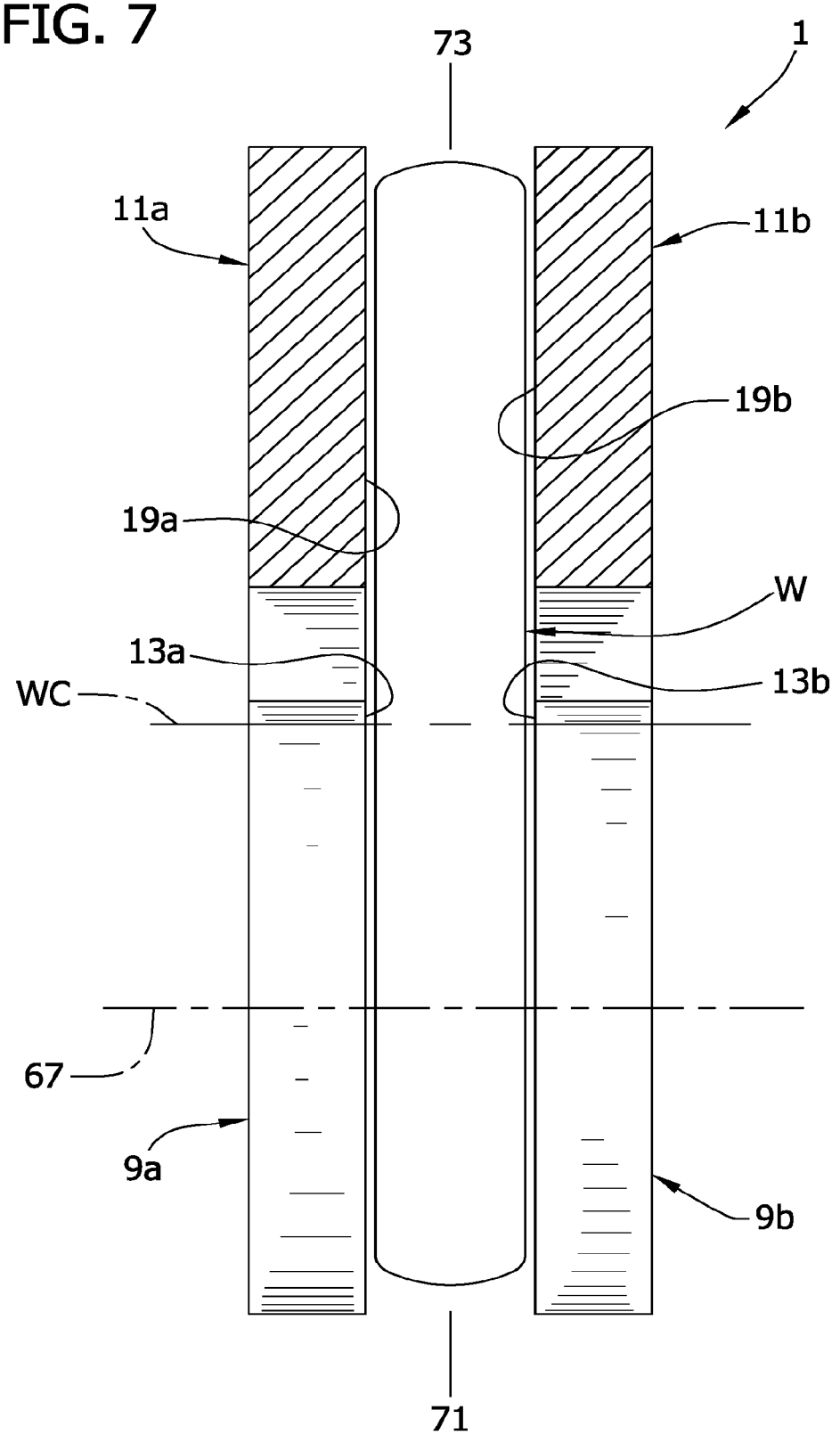
FIG. 7 is an enlarged schematic side elevation of the wafer-clamping device thereof, including the hydrostatic pads and grinding wheels with a semiconductor wafer positioned therebetween.

Referring again to the drawings, FIGS. 6 and 7 schematically show a wafer-clamping device according to the invention, designated generally at reference numeral 1. The clamping device is capable of being used in a double side grinder, which is designated generally at reference numeral 3 in FIG. 6. An example of a double side grinder in which the wafer clamping device 1 may be used includes model DXSG320 and model DXSG300A manufactured by Koyo Machine Industries Co., Ltd. The wafer-clamping device 1 holds a single semiconductor wafer (broadly, "a workpiece"), designated generally at W in the drawings, in a vertical position within the grinder 3 so that both surfaces of the wafer can be uniformly ground at the same time. This improves flatness and parallelism of the wafer's surfaces prior to steps of polishing and circuitry printing. It is understood that a grinder may have a clamping device that holds workpieces other than semiconductor wafers without departing from the scope of the invention.

As also shown in FIGS. 6 and 7, the wafer-clamping device 1 includes left and right grinding wheels, designated generally by reference numerals 9a and 9b, respectively, and left and right hydrostatic pads, designated by reference numerals 11a and 11b, respectively. The left and right designations are made for ease of description only and do not mandate any particular orientation of the wheels 9a and 9b and pads 11a and 11b. The letters "a" and "b" are used to distinguish parts of the left wheel 9a and left pad 11a from those of the right wheel 9b and right pad 11b. The grinding wheels 9a and 9b and hydrostatic pads 11a and 11b are mounted in the grinder 3 by means known to those of skill in the art.

As is also known in the art, the two grinding wheels 9a and 9b are substantially identical, and each wheel is generally flat. As seen in FIGS. 6 and 7, the grinding wheels 9a and 9b are generally positioned for grinding engagement with the wafer W toward a lower center of the wafer. A periphery of each wheel 9a and 9b extends below the periphery of the wafer W at the bottom of the wafer, and extends above a central axis WC of the wafer at the wafer's center. This ensures the entire surface area of each wafer W is ground during operation. In addition, at least one of the grinding wheels 9a or 9b can move relative to its paired grinding wheel. This facilitates loading the semiconductor wafer W in position between the grinding wheels 9a and 9b in the clamping device 1 of the grinder 3. Also in the illustrated clamping device 1, the left hydrostatic pad 11a can move relative to the corresponding left grinding wheel 9a and can also move relative to the right hydrostatic pad 11b, which remains fixed, to further facilitate loading the semiconductor wafer W into the device 1. A wafer-clamping device in which both pads are movable relative to corresponding grinding wheels or in which both pads are fixed during wafer loading, or a wafer-clamping device in which a hydrostatic pad and corresponding grinding wheel move together during wafer loading do not depart from the scope of the invention.

Still referring to the wafer-clamping device 1 shown in FIGS. 6 and 7, during grinding operation, the two grinding wheels 9a and 9b and two hydrostatic pads 11a and 11b of the wafer-clamping device are arranged in opposed relation for holding the semiconductor wafer W therebetween. The grinding wheels 9a and 9b and hydrostatic pads 11a and 11b define vertical clamping planes 71 and 73, respectively, and produce clamping pressures on the wafer W that help hold the wafer in its vertical position. This will be described in more detail hereinafter.

Referring particularly to FIG. 6, the hydrostatic pads 11a and 11b remain stationary during operation while a drive ring, designated generally by reference numeral 14, moves the wafer W in rotation relative to the pads and grinding wheels 9a and 9b. As is known in the art, a detent, or coupon 15, of the drive ring 14 engages the wafer W generally at a notch N (illustrated by broken lines in FIG. 6) formed in a periphery of the wafer to move the wafer in rotation about its central axis WC (central axis WC generally corresponds to horizontal axes 44a and 44b of pads 11a and 11b (see FIGS. 8 and 12)). At the same time, the grinding wheels 9a and 9b engage the wafer W and rotate in opposite directions to one another. One of the wheels 9a and 9b rotates in the same direction as the wafer W and the other rotates in an opposite direction to the wafer.

Figure 10:
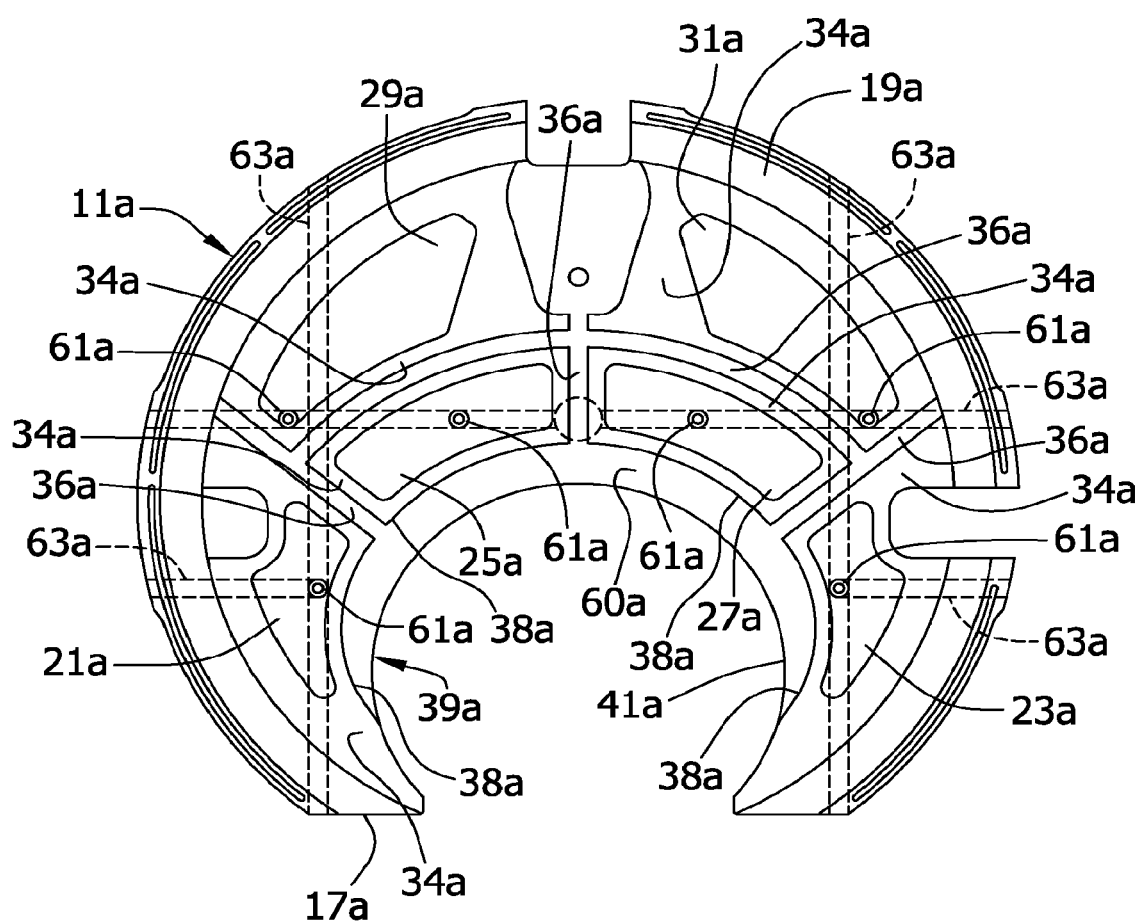
FIG. 10 is a wafer-side elevation similar to FIG. 9A showing channels connecting fluid injection ports within the hydrostatic pockets of the pad.
Figure 11:
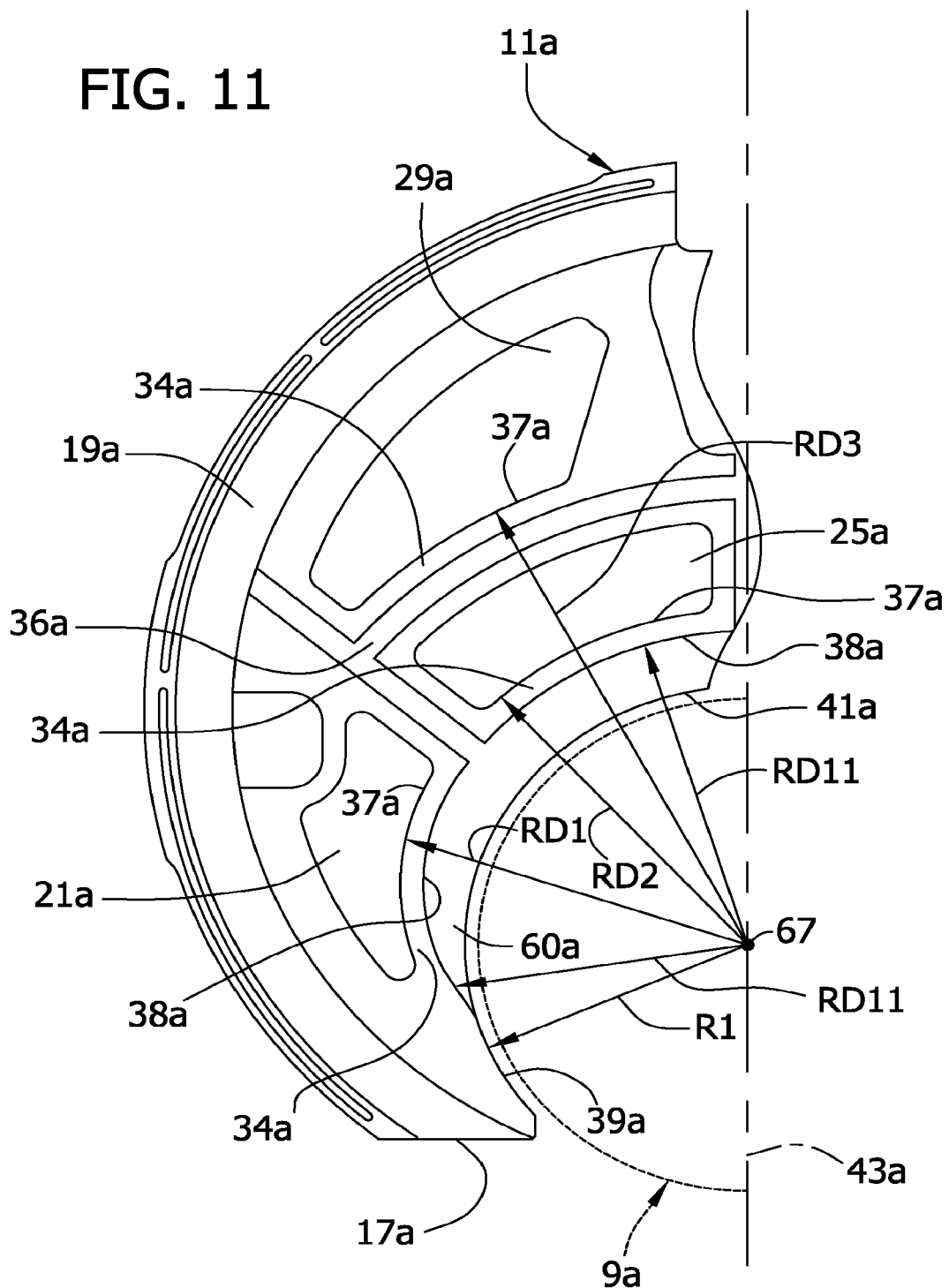
FIG. 11 is an enlarged fragmentary elevation of the hydrostatic pad of FIG. 9A illustrating location of hydrostatic pockets relative to a grinding wheel opening of the pad.
Figure 12:
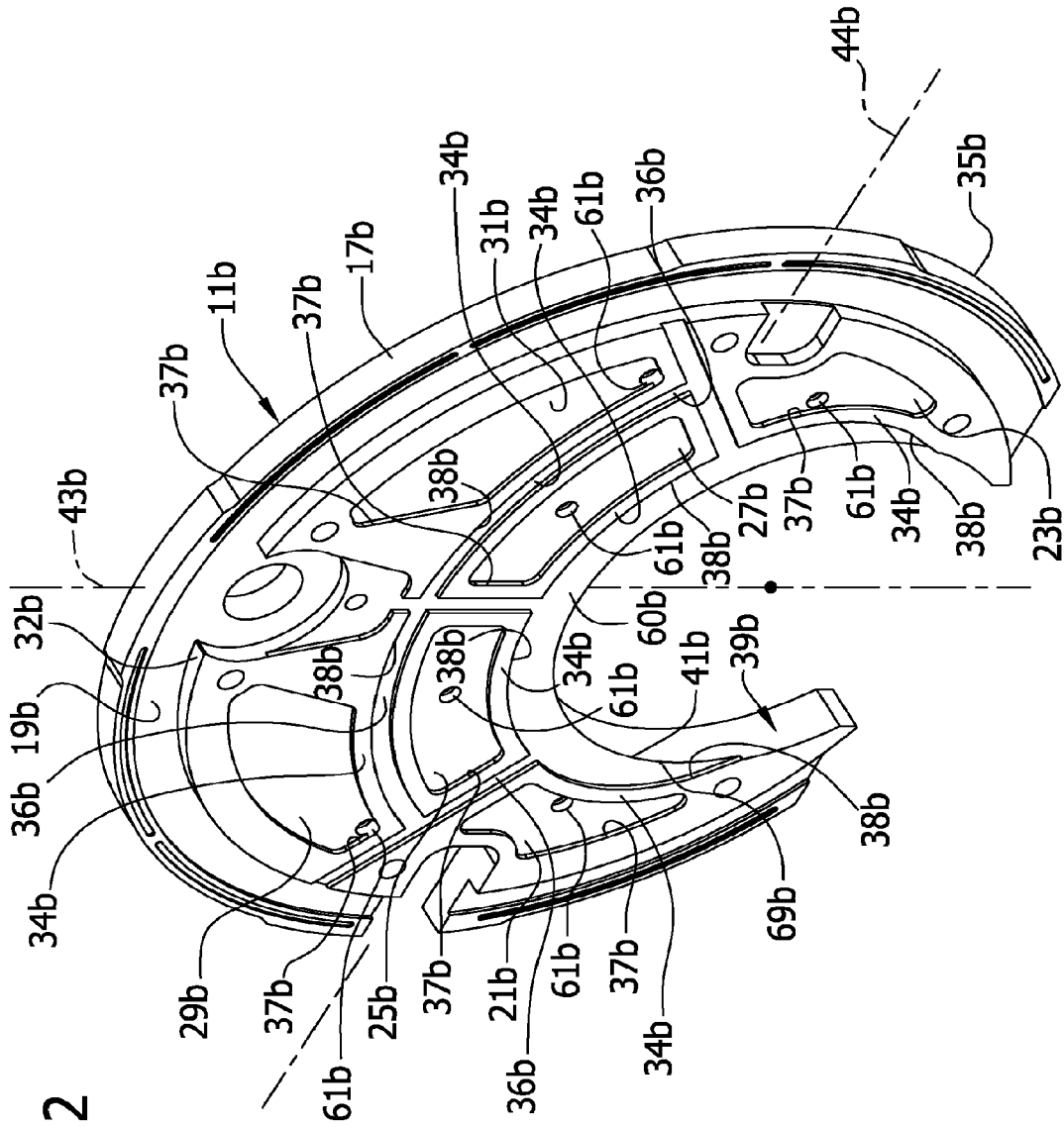
FIG. 12 is a perspective similar to FIG. 8 of a right hydrostatic pad, which opposes the left hydrostatic pad during grinding operation such that a wafer can be held between the two pads.
Figure 13B:
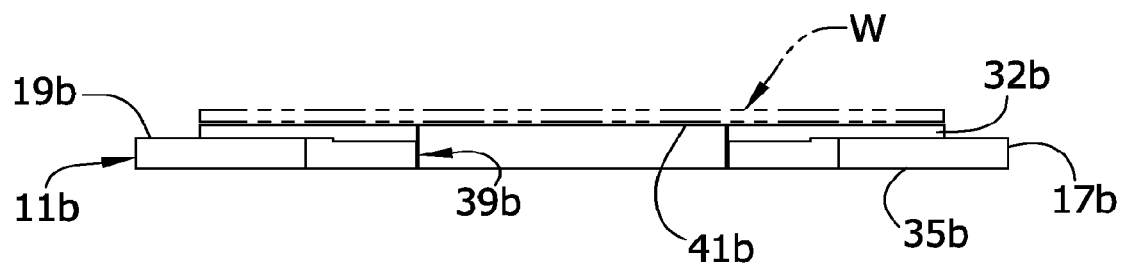
FIG. 13B is a bottom plan thereof.

Referring now to FIGS. 8-13B, the hydrostatic pads 11a and 11b of the invention are shown in greater detail. FIGS. 8-11 illustrate the left hydrostatic pad 11a, and FIGS. 12-13B illustrate the opposing right hydrostatic pad 11b. As can be seen, the two pads 11a and 11b are substantially identical and are generally mirror images of each other. Therefore, only the left pad 11a will be described with it understood that a description of the right pad 11b is the same.

Figure 8:
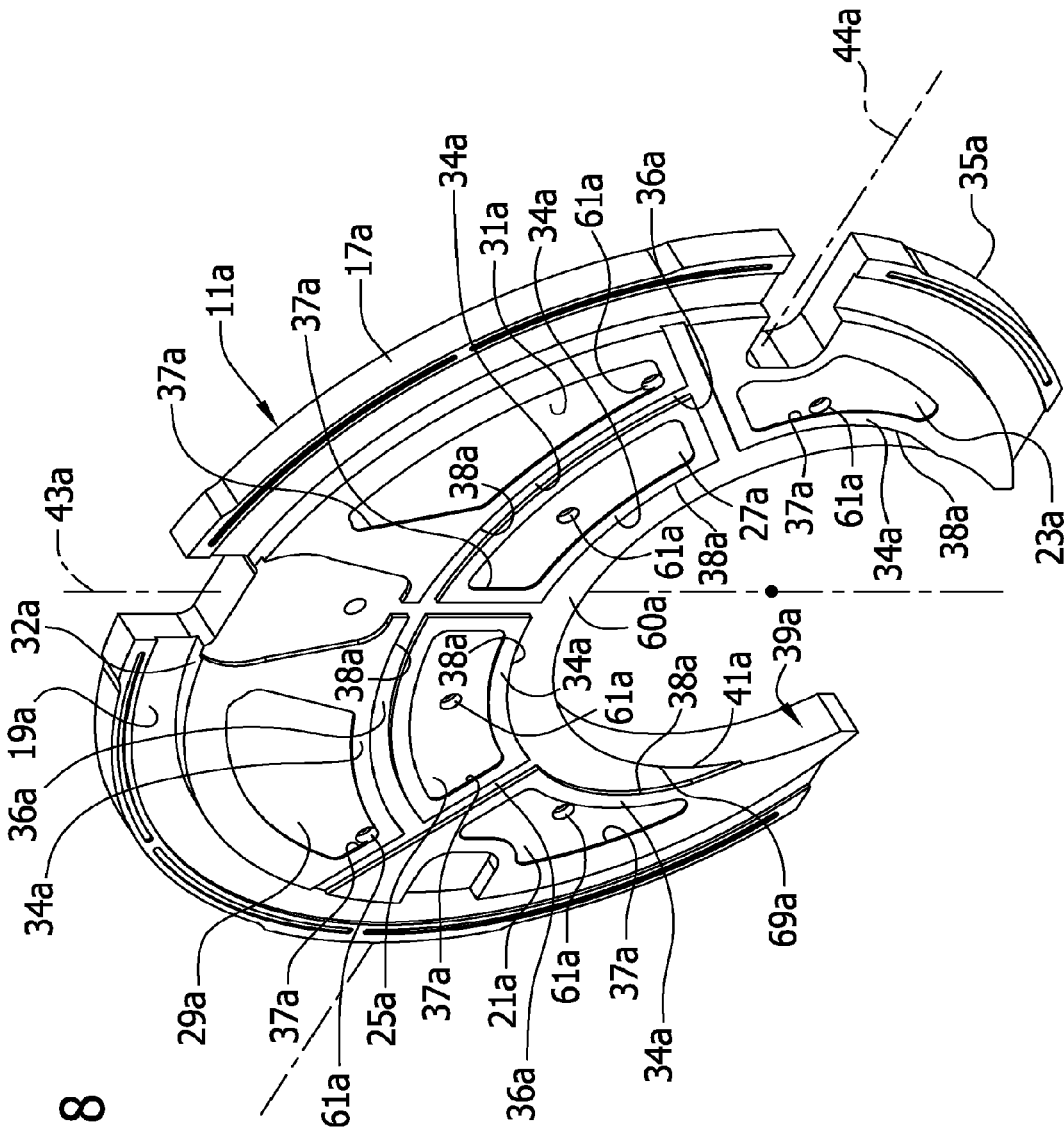
FIG. 8 is a perspective of a left hydrostatic pad of the present invention, showing hydrostatic pocket configuration of a face of the pad that opposes the wafer during grinding operation.
Figure 9A:
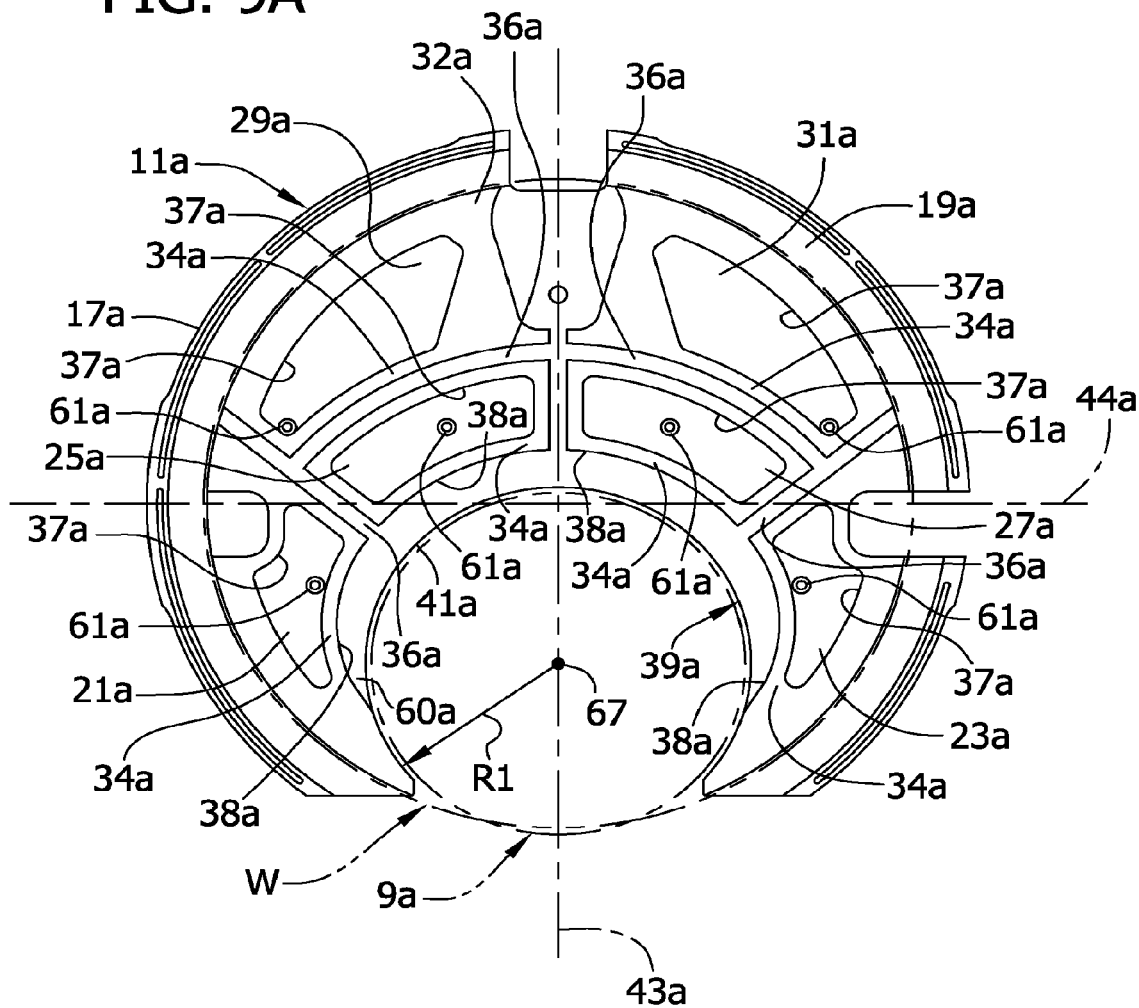
FIG. 9A is a wafer-side elevation of the left hydrostatic pad of FIG. 8, showing a grinding wheel and the wafer in phantom to illustrate their positional relationships with the pad.
Figure 9B:
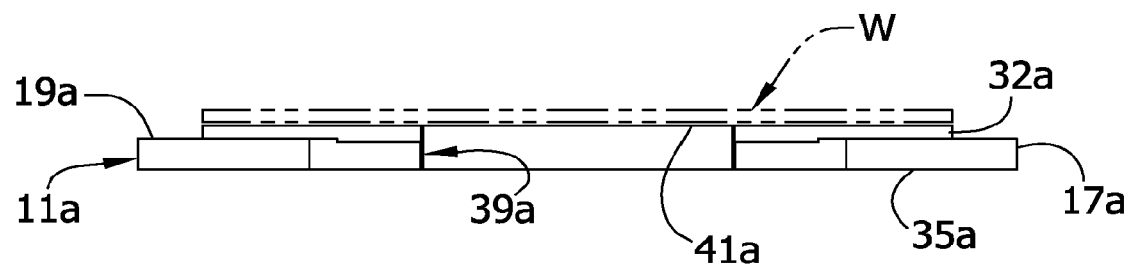
FIG. 9b is a Bottom Plan of the Hydrostatic Pad of FIG. 9A with the wafer again shown in phantom.

As shown in FIGS. 8-9B, the left hydrostatic pad 11a is generally thin and circular in shape and has a size similar to the wafer W being processed. The wafer W is illustrated in phantom in FIGS. 9A and 9B to show this relationship. The illustrated hydrostatic pad 11a has a diameter of about 36.5 cm (14.4 in) and a working surface area facing the wafer W during operation of about 900 cm$^2$ (139.5 in$^2$). It is therefore capable of being used to grind standard wafers having diameters, for example, of about 300 mm. It should be understood, though, that a hydrostatic pad might have a different diameter and surface area without departing from the scope of the invention. For example, a pad may be sized on a reduced scale for use to grind a 200 mm wafer.

As best seen in FIGS. 8 and 9A, a body 17a of the hydrostatic pad 11a includes a wafer side face 19a immediately opposite the wafer W during the grinding operation. Six hydrostatic pockets 21a, 23a, 25a, 27a, 29a and 31a formed in the wafer side face 19a are each positioned generally radially about a grinding wheel opening (indicated generally by reference numeral 39a) of the pad 11a. A back side 35a of the pad body 17a, opposite the wafer side face 19a, is generally flat and free of hydrostatic pockets, but could include pockets without departing from the scope of the invention. In addition, a hydrostatic pad with more or fewer than six hydrostatic pockets, for example, four pockets, does not depart from the scope of the invention.

The six hydrostatic pockets 21a, 23a, 25a, 27a, 29a, and 31a are each arcuate in shape and elongate in a generally circumferential direction around the pad 11a. Each pocket 21a, 23a, 25a, 27a, 29a, and 31a is recessed into a raised surface 32a of the wafer side face 19a, and each includes relatively flat vertical sidewalls 37a and rounded perimeter corners. The pockets are formed by cutting or casting shallow cavities into the face 19a of the pad 11a. Hydrostatic pockets formed by different processes do not depart from the scope of the invention.

Figure 1:
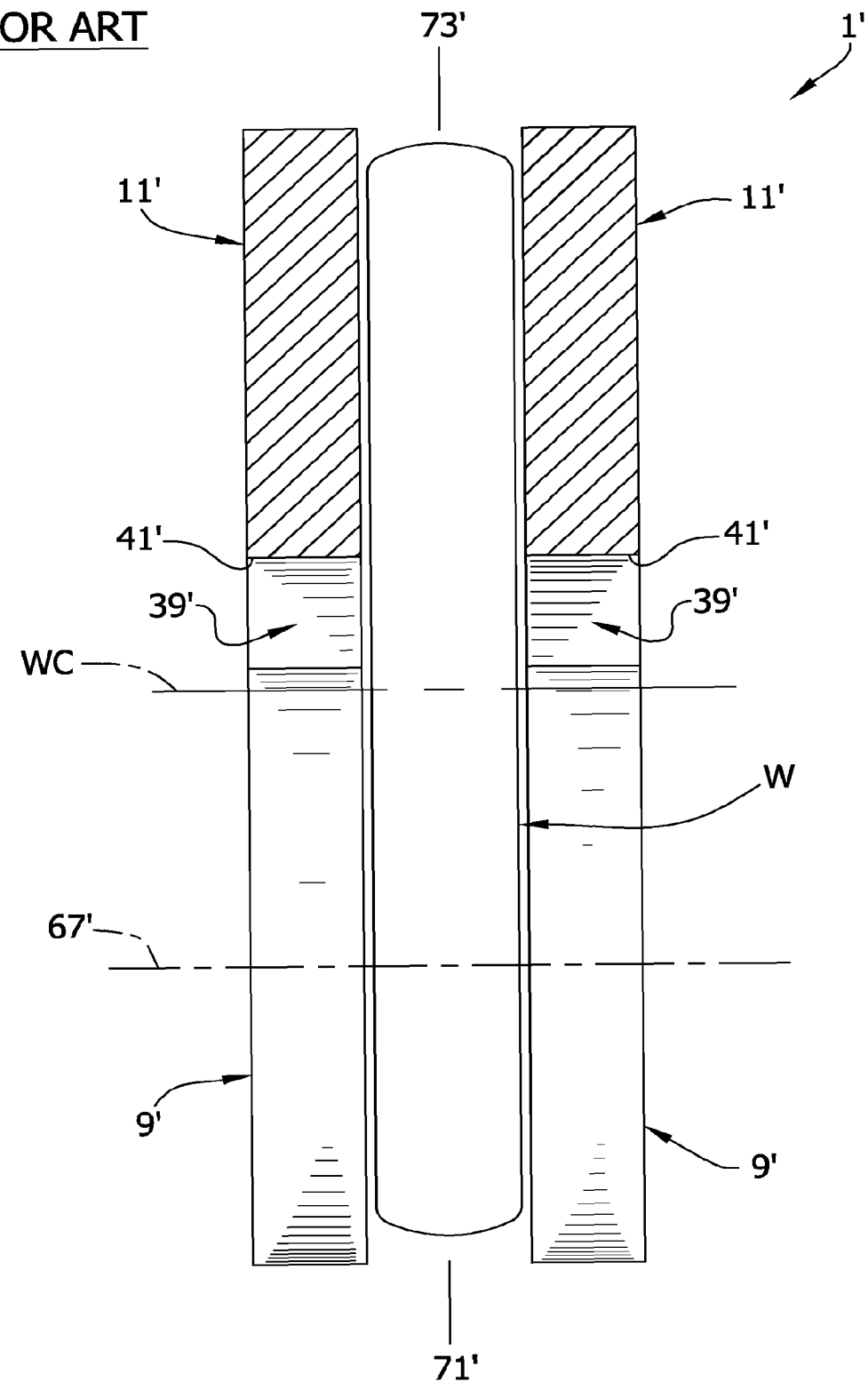
FIG. 1 is a schematic side elevation of a wafer-clamping device of the prior art, including hydrostatic pads and grinding wheels with a semiconductor wafer positioned therebetween and the hydrostatic pads shown in section.
Figure 2:
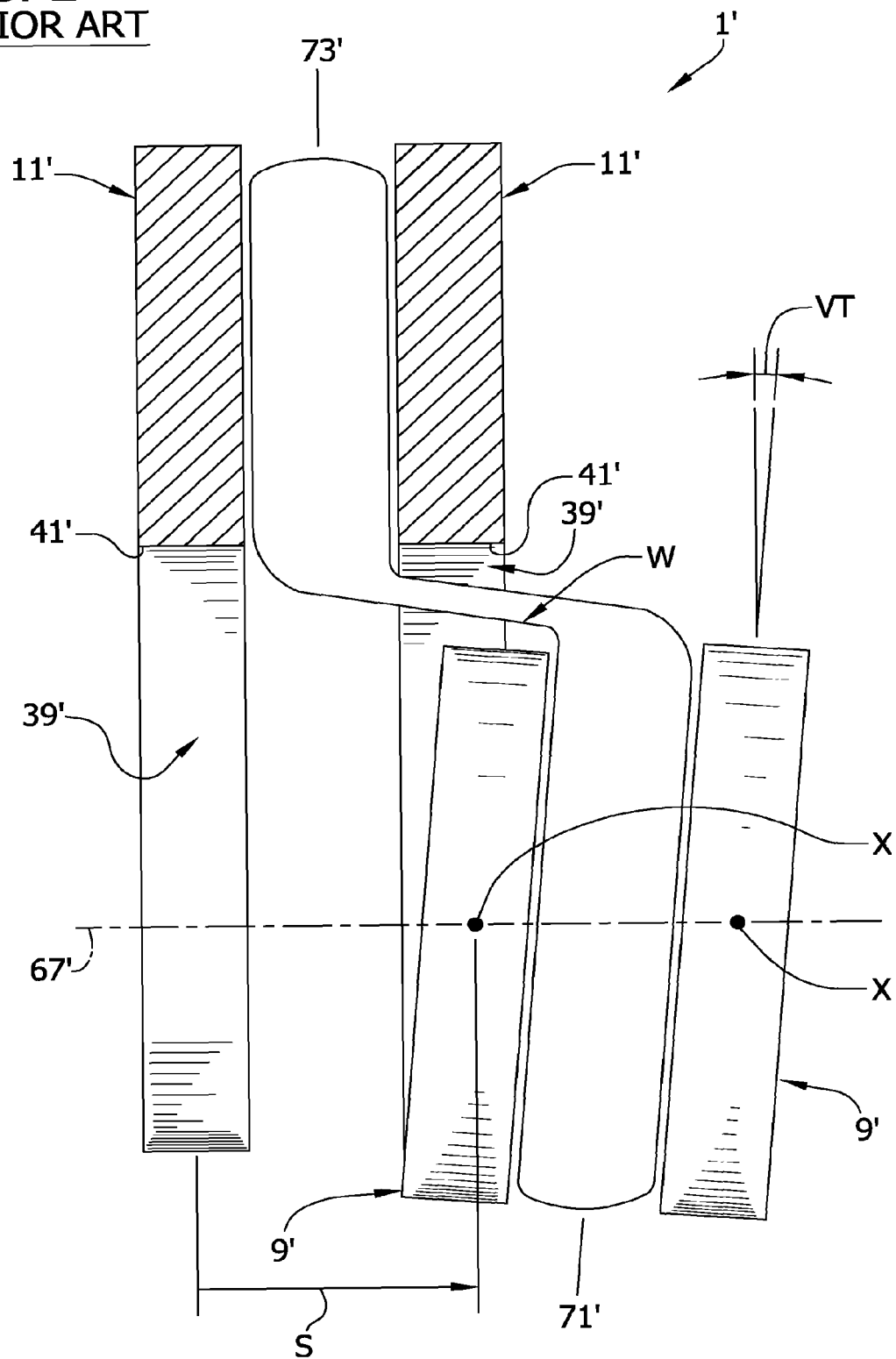
FIG. 2 is a schematic side elevation similar to FIG. 1, but with the grinding wheels laterally shifted and vertically tilted.
Figure 3:
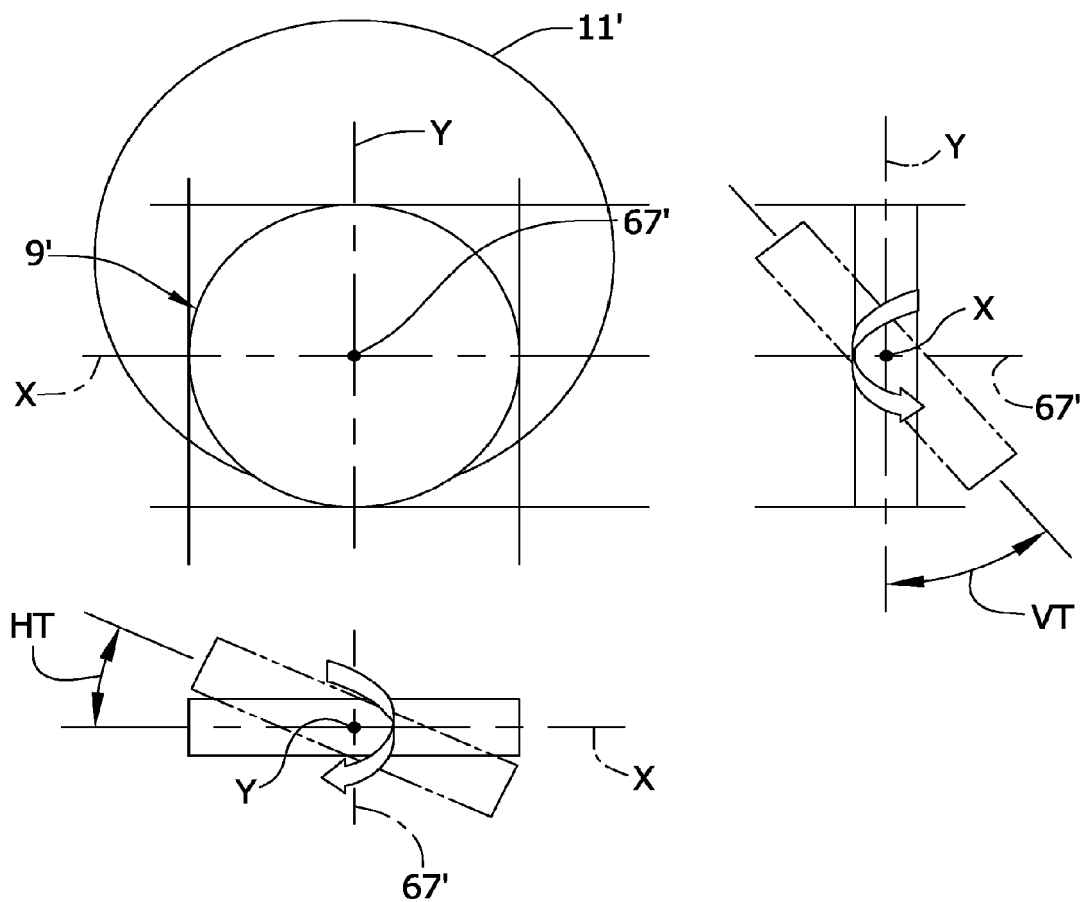
FIG. 3 is a schematic front elevation thereof illustrating horizontal tilt and vertical tilt of a grinding wheel.
Figure 4:
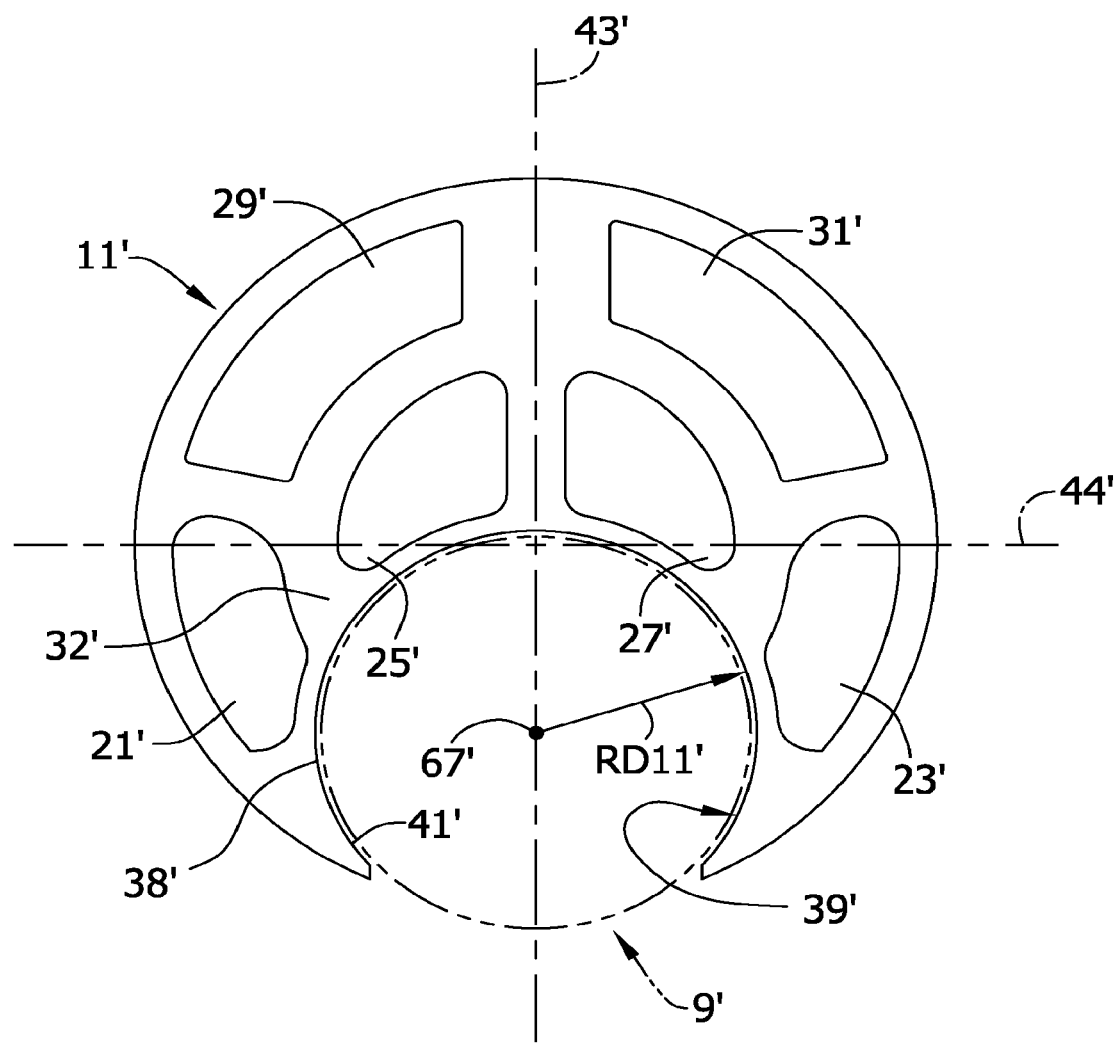
FIG. 4 is a schematic of a wafer side of one of the prior art hydrostatic pads of FIG. 1.

Still referring to FIGS. 8 and 9A, it can be seen that each of the pairs of pockets 21a and 23a, 25a and 27a, and 29a and 31a are substantially the same size and shape. Moreover, in the illustrated pad 11a, pockets 21a and 23a each have a surface area of about 14.38 cm$^2$ (2.23 in$^2$); pockets 25a and 27a each have a surface area of about 27.22 cm$^2$ (4.22 in$^2$); and pockets 29a and 31a each have a surface area of about 36.18 cm$^2$ (5.61 in$^2$). A total pocket surface area of pad 11a is about 155.56 cm$^2$ (24.11 in$^2$) and a ratio of total pocket surface area to the working surface area of the pad is about 0.17. This ratio can be other than 0.17 and still be within the scope of the present invention. For example, the ratio may be about 0.26 or less. By comparison in prior art pads 11' (FIG. 4), a surface area of each of pockets 21' and 23' is about 31.82 cm$^2$ (4.93 in$^2$); a surface area of each of pockets 25' and 27' is about 36.47 cm$^2$ (5.65 in$^2$); and a surface area of each of pockets 29' and 31' is about 47.89 cm$^2$ (7.42 in$^2$). A total pocket surface area of the prior art pad 11' is about 232.36 cm$^2$ (36.02 in$^2$), and a ratio of total pocket surface area to pad working surface area is about 0.26 (the working surface area for pad 11' is about 900 cm$^2$ (139.5 in$^2$)).

Pockets 21a and 23a, 25a and 27a, and 29a and 31a, respectively, are also symmetrically located on opposite halves of the wafer side face 19a (as separated by vertical axis 43a of the pad 11a). Pockets 21a and 23a are generally below horizontal axis 44a of the pad 11a, while pockets 25a, 27a, 29a, and 31a are generally above axis 44a. Pockets 29a and 31a are generally above pockets 25a and 27a and are not located adjacent grinding wheel opening 39a, but are spaced away from the opening with pockets 25a and 27a located therebetween. In this pocket orientation, about 15% of the total pocket surface area is located below horizontal axis 44a. This percentage can be 23% or less without departing from the scope of the invention. By comparison in prior art pads 11', at least about 24% of the total pocket surface area is located below the pad's horizontal axis 44'. It should be understood that increased pocket area below axis 44' increases clamping force applied on the wafer by pad 11' toward the sides of grinding wheel opening 39' and contributes to B-ring formation.

FIGS. 8 and 9A show the circular grinding wheel opening 39a that is formed in a lower portion of the body 17a of the hydrostatic pad 11a and is sized and shaped for receiving grinding wheel 9a through the pad and into engagement with the lower center of the wafer W (the grinding wheel and wafer are illustrated in phantom in FIG. 9A). A center of opening 39a generally corresponds to rotational axis 67 of grinding wheel 9a (and 9b) when received in the opening. In the illustrated pad 11a, a radius R1 of grinding wheel opening 39a is about 87 mm (3.43 in) and a distance between peripheral edges of the grinding wheel 9a and radially opposed edge 41a of the grinding wheel opening is relatively uniform and is generally on the order of about 5 mm (0.20 in). These distances can be different without departing from the scope of the invention.

As also shown, raised surface 32a of pad 11a comprises coextensive plateaus 34a extending around the perimeter of each pocket 21a, 23a, 25a, 27a, 29a, and 31a. Drain channels, each designated by reference numeral 36a, are formed in the raised surface 32a between each plateau 34a of the pockets 21a, 23a, 25a, 27a, 29a, and 31a. A roughly crescent shaped free region 60a is recessed into the raised surface between grinding wheel opening peripheral edge 41a and edges 38a of inner portions of plateaus 34a of pockets 21a, 23a, 25a, and 27a. Clamping force on the wafer W is effectively zero at free region 60a. These features will be further explained hereinafter.

Referring now to FIG. 10, hydrostatic pockets 21a, 23a, 25a, 27a, 29a, and 31a each include a fluid injection port 61a for introducing fluid into the pockets. Channels 63a (illustrated by hidden lines) within the pad body 17a interconnect the fluid injection ports 61a and supply the fluid from an external fluid source (not shown) to the pockets. The fluid is forced into the pockets 21a, 23a, 25a, 27a, 29a, and 31a under relatively constant pressure during operation such that the fluid, and not the pad face 19a, contacts the wafer W during grinding. In this manner, the fluid at pockets 21a, 23a, 25a, 27a, 29a, and 31a holds the wafer W vertically within pad clamping plane 73 (see FIGS. 6 and 7) but still provides a lubricated bearing area, or sliding barrier, that allows the wafer W to rotate relative to the pad 11a (and 11b) during grinding with very low frictional resistance. Clamping force of the pad 11a is provided primarily at pockets 21a, 23a, 25a, 27a, 29a, and 31a.

FIG. 11 shows orientation of pockets 21a, 25a, and 29a in more detail with reference to a left half of the wafer side face 19a of pad 11a. Radial distances RD1, RD2, and RD3 indicate location of peripheral edges of the nearest vertical side wall 37a of pockets 21a, 25a, and 29a, respectively (the nearest vertical sidewall 37a refers to the vertical side wall closest to edge 41a of grinding wheel opening 39a) from the center of the grinding wheel opening, which ideally corresponds to grinding wheel rotational axis 67. As illustrated, distance RD1 is nonconstant around nearest vertical sidewall 37a of pocket 21a such that a bottom end of pocket 21a is further from opening 39a than a top end. Specifically, distance RD1 ranges from about 104 mm (4.1 in) toward the bottom end of the pocket to about 112 mm (4.4 in) toward the top end (these values are the same for pocket 23a). Radial distances RD2 and RD3 are relatively constant to nearest vertical walls 37a of pockets 25a and 29a, respectively, with RD2 having a value of about 113 mm (4.4 in) and RD3 having a value of about 165 mm (6.5 in) (these values are the same for pockets 27a and 31a, respectively). Radial distance RD1 may be constant and radial distances RD2 and RD3 may be nonconstant without departing from the scope of the invention.

FIG. 11 also shows radial distance RD11 measured radially from grinding wheel rotational axis 67 to the radially innermost edge 38a of plateaus 34a of pockets 21a and 25a. The edge 38a defines the end, or boundary, of zero pressure (free) region 60a. As can be seen, radial distance RD11 is nonconstant to edge 38a, and in illustrated pad 11a ranges from about 108 mm (4.25 in) near vertical axis 43a to about 87 mm (3.43 in) near the bottom end of pocket 21a where edge 38a merges with grinding wheel opening edge 41a. These same measurements, when made from the peripheral edge of grinding wheel 9a (when received in opening 39a) to a radially opposed innermost portion of edge 38a, range from about 26 mm (1.02 in) near vertical axis 43a to about 5 mm (0.20 in) near the bottom end of pocket 21a and form ratios with radius R1 of grinding wheel opening 39a ranging from about 0.30 to about 0.057. By comparison, corresponding distances in the prior art hydrostatic pad 11' (FIG. 4) are constant because innermost peripheral edge 38' of the raised surface 32' coincides with grinding wheel opening edge 41' (i.e., there is no zero pressure (free) region in the prior art pad 11'). In this pad 11', radial distance RD11' is about 87 mm (3.43 in) and the same measurement from the peripheral edge of the grinding wheel 9' to edge 38' is about 5 mm (0.20 in).

Hydrostatic pads 11a and 11b of the invention have at least the following beneficial features as compared to prior art hydrostatic pads 11'. Total hydrostatic pocket surface area is reduced. This effectively reduces overall clamping force applied by the pads on the wafer W because the volume of fluid received into the hydrostatic pockets 21a, 23a, 25a, 27a, 29a, 31a, 21b, 23b, 25b, 27b, 29b, and 31b during operation is reduced. In addition, the pocket surface area below horizontal axis 44a is reduced. This specifically lowers clamping forces at the left and right sides of grinding wheel openings 39a and 39b. Furthermore, inner pockets 21a, 23a, 25a, 27a, 21b, 23b, 25b, and 27b are moved away from grinding wheel opening edges 41a and 41b with free regions 60a and 60b of zero pressure formed therebetween. This specifically lowers clamping forces around edges 41a and 41b of grinding wheel openings 39a and 39b.

Figure 5A:
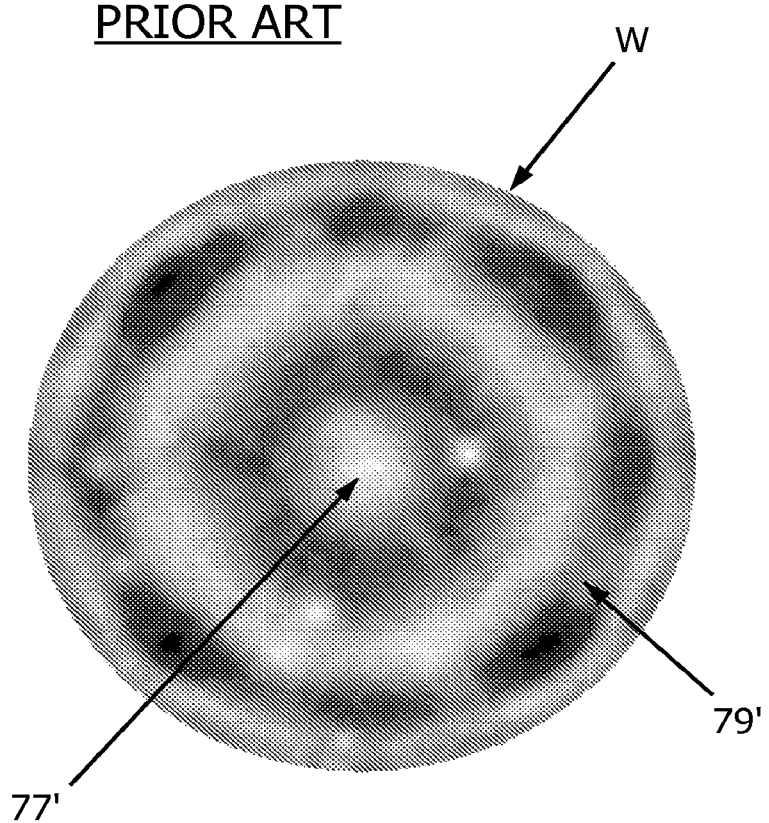
FIG. 5A is a pictorial representation of nanotopology surface features of a semiconductor wafer ground using the wafer-clamping device of FIG. 1 and subsequently polished.
Figure 5B:
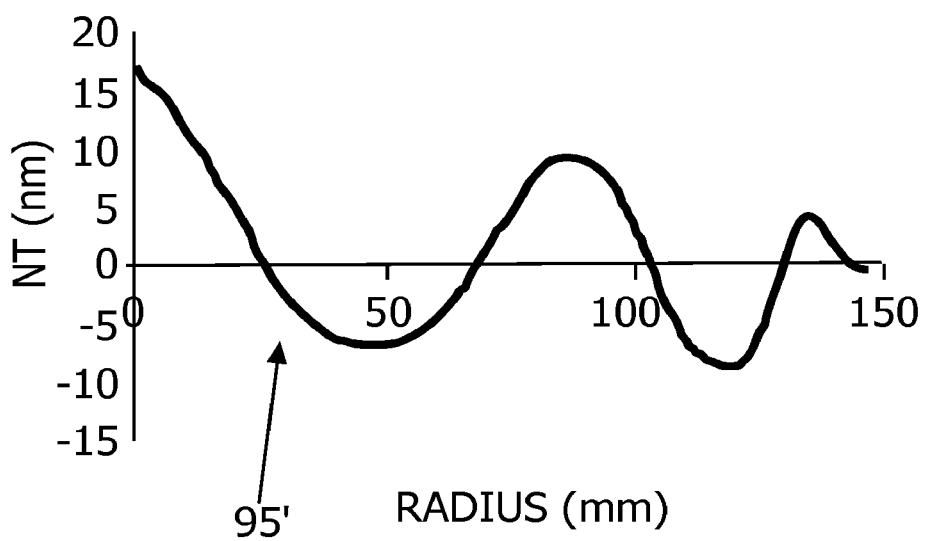
FIG. 5B is a graphical representation of the radial profile of the surface of the wafer of FIG. 5A.
Figure 14:
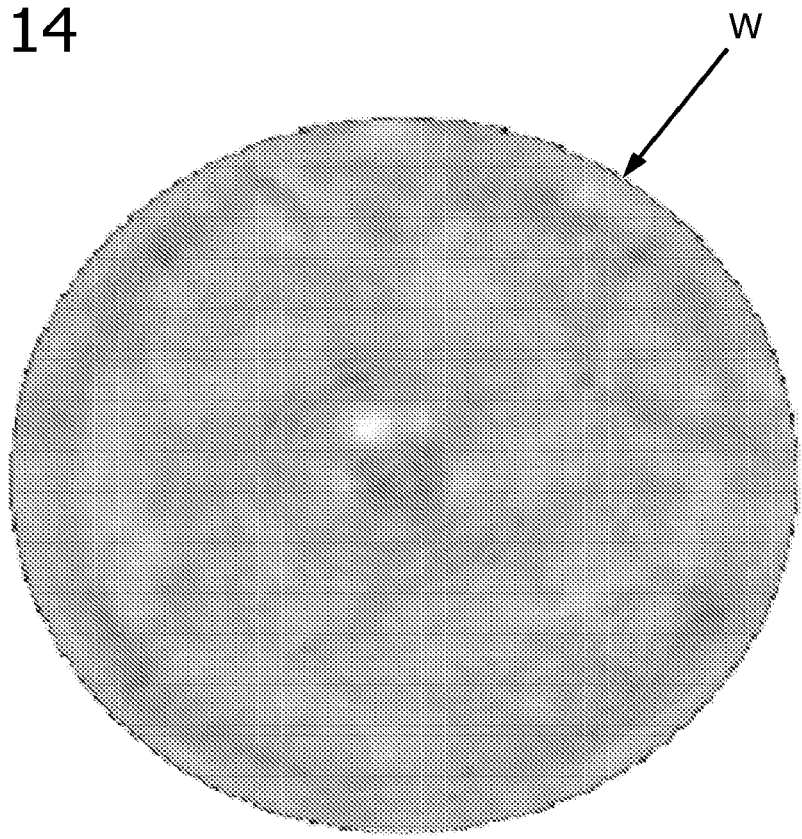
FIG. 14 is pictorial representation similar to FIG. 5A, but showing a semiconductor wafer ground using the wafer-clamping device of FIG. 6 and subsequently polished.

Wafers W are held less rigidly by hydrostatic pads 11a and 11b during grinding operation so that they can conform more easily to shift and/or tilt movements of grinding wheels 9a and 9b. This reduces the magnitude of hydrostatic clamping moments that form when grinding wheels 9a and 9b move (i.e., less stresses form in the bending region of the wafer). In addition, the wafer W is not tightly held adjacent grinding wheel opening edges 41a. The wafer W may still bend adjacent grinding wheel opening edge 41a when the wheels move, but not as sharply as in prior art grinding devices. Therefore, hydrostatic pads 11a and 11b promote more uniform grinding over the surfaces of wafers W, and nanotopology degradation, such as formation of B-rings and centermarks (C-marks), of the ground wafers is reduced or eliminated. This can be seen by comparing FIGS. 5A and 14. FIG. 5A illustrates a wafer W ground using prior art hydrostatic pads 11' while FIG. 14 illustrates a wafer W ground using pads 11a and 11b of the invention. The wafer shown in FIG. 14 is substantially free of B-rings and center-marks (C-marks).

Figure 15A:
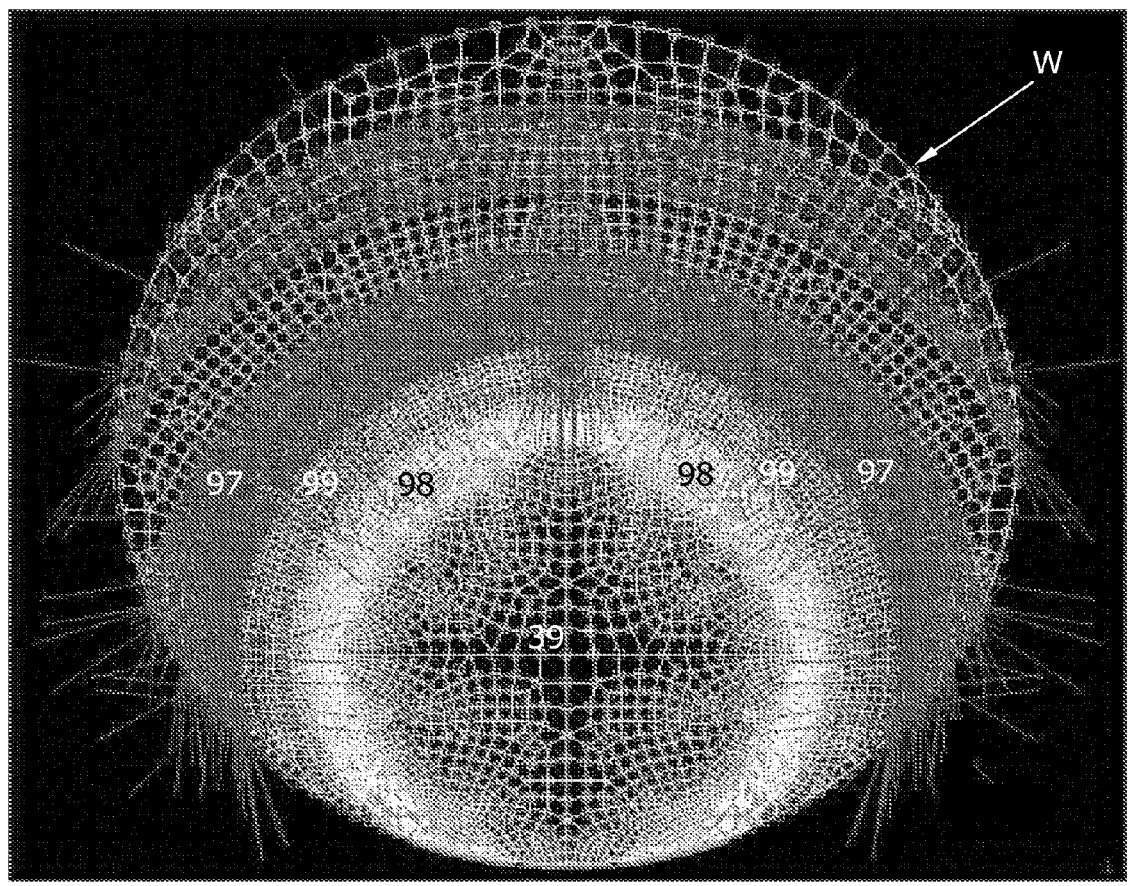
FIG. 15A is a pictorial representation of clamping stresses applied to a surface of a semiconductor wafer during grinding when the wafer is held by hydrostatic pads according to the invention.

FIGS. 15A-19 illustrate the stresses in a wafer W held by pads 11a and 11b of the invention and by prior art pads 11'. FIGS. 15A and 15B visually illustrate these stresses when grinding wheel and hydrostatic pad clamping planes are aligned. In both wafers W, stress is negligible within grinding wheel openings 39 and 39' (the pad does not clamp the wafer in these regions). FIG. 15A shows the lower stresses formed in wafer W when held by pads 11a and 11b. It particularly indicates lower stresses (light-color regions indicated at 98 and 99) over the entire surface of wafer W adjacent grinding wheel opening edges 41a and 41b. It also indicates more uniformly distributed stresses through the wafer. By contrast, and as shown in FIG. 15B, largest stresses 97 in wafer W held by pads 11' are in close proximity to peripheral edges of openings 39' (i.e., there is no zero pressure (free) region).

Figure 15B:
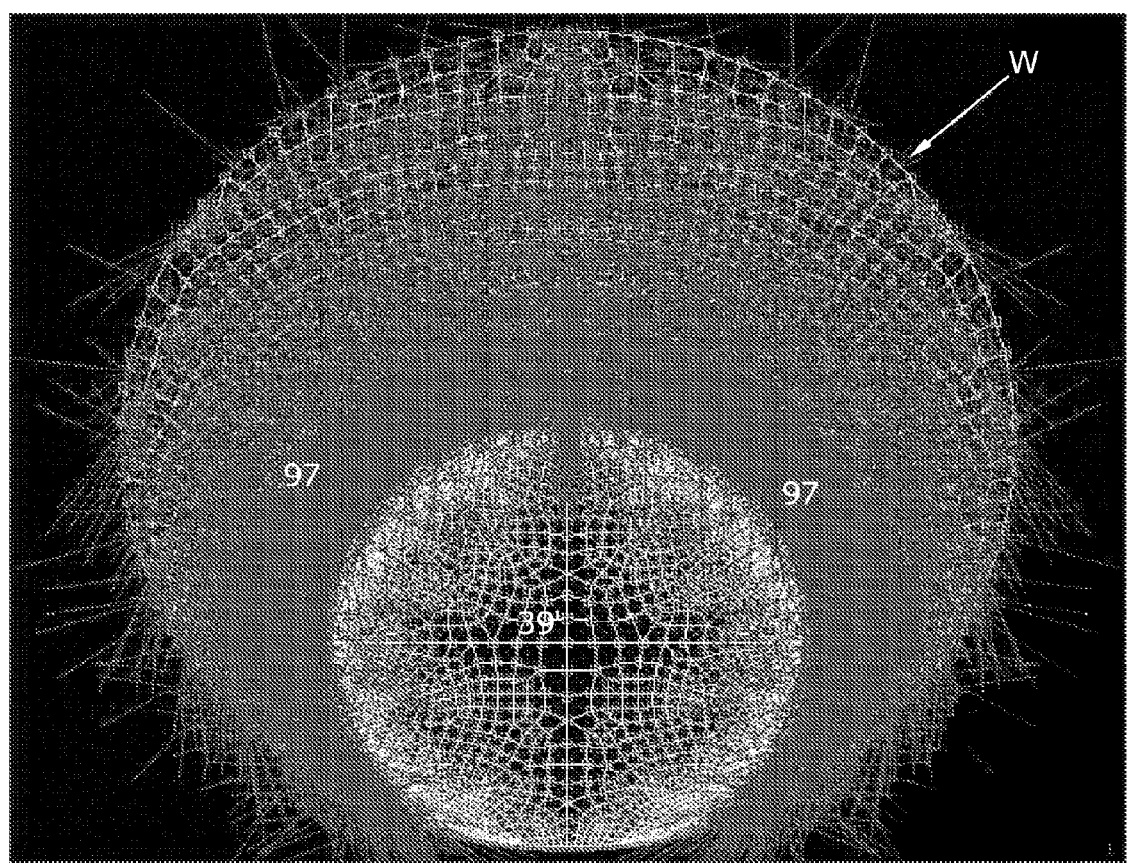
FIG. 15B is a pictorial representation similar to FIG. 15A of clamping stresses on a wafer held by hydrostatic pads of the prior art.

As can also be seen by comparing FIGS. 15A and 15B, concentrated areas of large stress 97 are not as prevalent during grinding using the pads 11a and 11b as they are when using pads 11' (FIG. 15B). The advantage is both less localized deformation of the wafer W in the bending areas (e.g., adjacent grinding wheel opening edge 41a) and more uniform wear of the grinding wheels 9a and 9b. Uniform wheel wear ensures that the wheels do not change shape during grinding (i.e., no differential wheel wear). This also ensures that the grinder is able to maintain the lower nanotopology settings for longer periods of time. Also, if the wheels do shift or tilt, the stresses caused by the movement are effectively distributed through the wafer W with less pronounced formation of center-marks (C-marks) and B-rings. This desirably makes the grinding nanotopology less sensitive to shifts and tilts of the grinding wheels.

FIGS. 16-19 graphically illustrate lower stresses in wafer W during grinding operation using hydrostatic pads 11a and 11b when grinding wheels 9a and 9b shift and/or tilt. The illustrated stresses are those occurring in wafer W adjacent grinding wheel opening edges 41a and 41b and measured at locations around edges 41a and 41b beginning at about a seven o'clock position (arc length of 0 mm) and moving clockwise around the perimeter edges (to arc length of about 400 mm). Stresses in wafers W held by prior art hydrostatic pads 11' are designated generally by reference numeral 91 and stresses in wafers held by pads 11a and 11b are designated generally by reference numeral 93.

Figure 16:
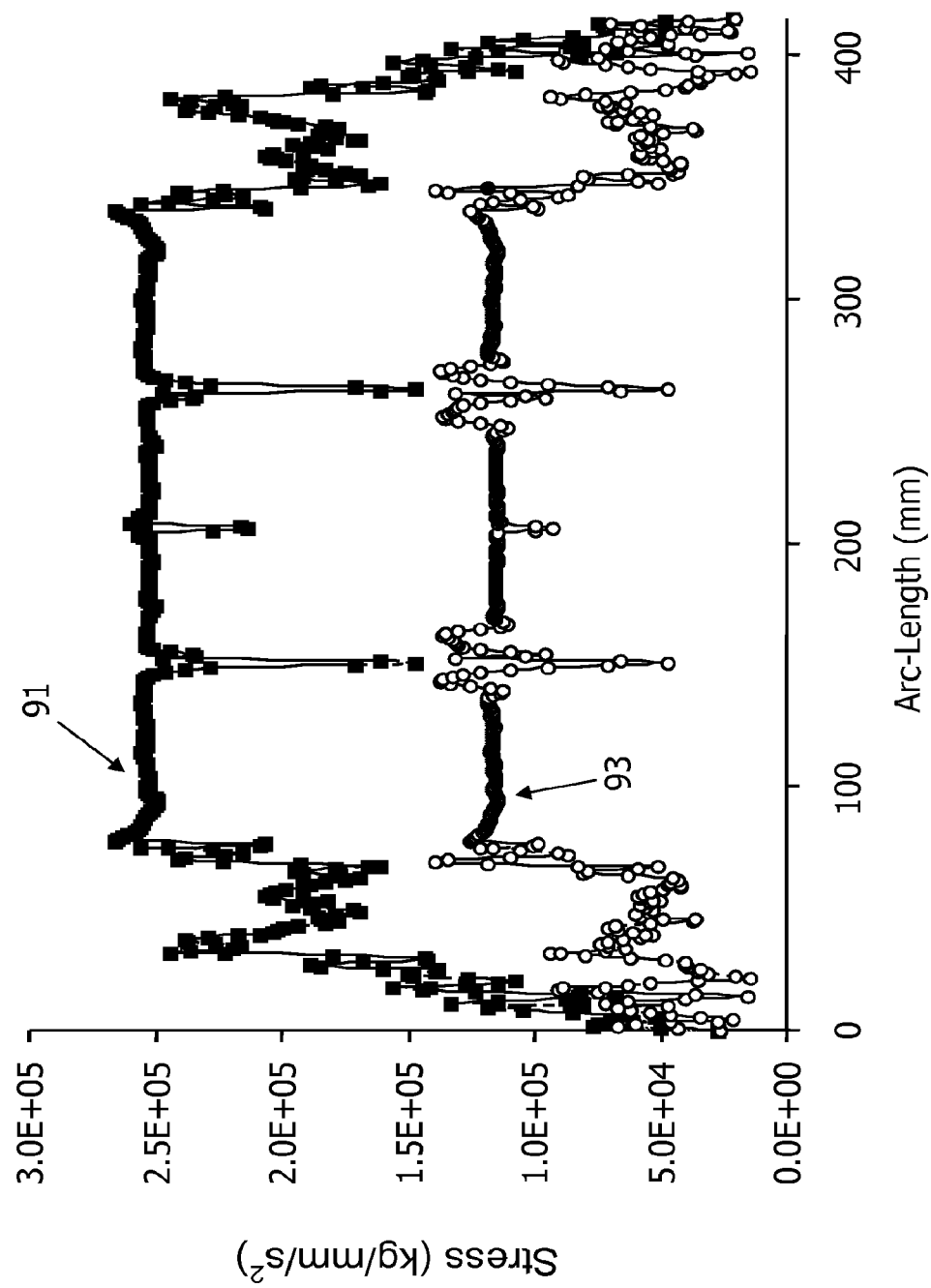
FIG. 16 is a graph showing stresses in semiconductor wafers adjacent a periphery of the grinding wheels during grinding when the grinding wheels laterally shift, and comparing wafers held by hydrostatic pads according to the present invention to wafers held by hydrostatic pads of the prior art.

FIG. 16 illustrates the stresses 91 and 93 when the grinding wheels shift. As can be seen, stresses 93 are significantly less than stresses 91, and are more nearly constant around the entire periphery of grinding wheel openings 39a and 39b than stresses 91, including at the centers WC of the wafers W (corresponding to an arc length of about 200 mm). Accordingly, in the present invention, when the grinding wheels 9a and 9b shift, the wafers W do not bend as sharply near their centers as compared to wafers ground in prior art devices.

Figure 17:
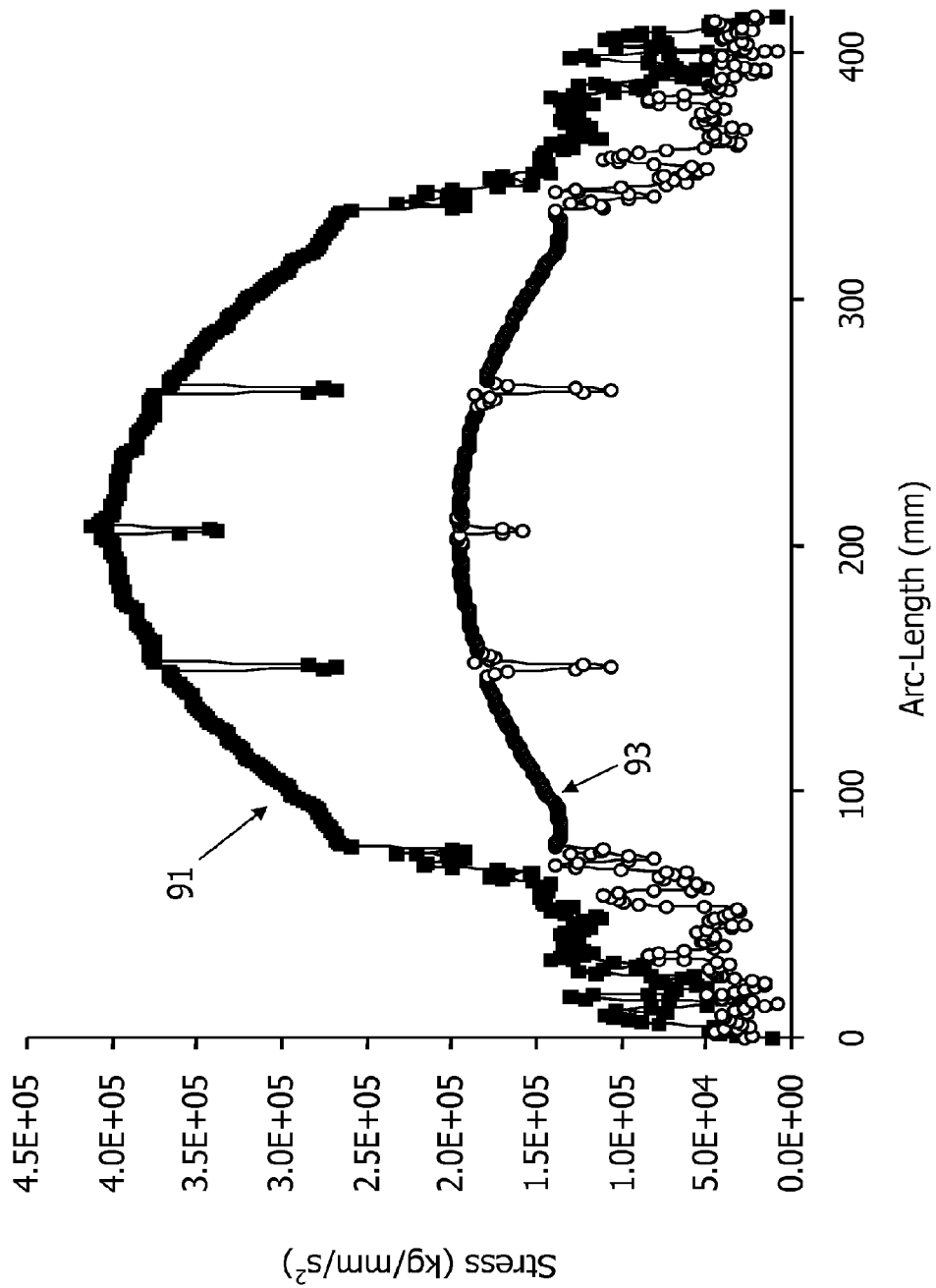
FIG. 17 is a graph similar to FIG. 16 comparing stresses in wafers resulting from lateral shift and vertical tilt of the grinding wheels.

FIG. 17 illustrates stresses 91 and 93 in wafers W when the grinding wheels shift and vertically tilt. Again, stresses 93 associated with pads 11a and 11b are generally constant along the entire periphery of the grinding wheel opening edges 39a and 39b. In addition, there is a markedly less increase in stress 93 in the wafers W held by pads 11a and 11b at locations corresponding to the wafer centers WC. Accordingly, when the grinding wheels 9a and 9b shift and vertically tilt, the wafers W do not bend as sharply adjacent the periphery of the grinding wheel openings 39a and 39b and center-mark (C-mark) formation is reduced.

Figure 18:
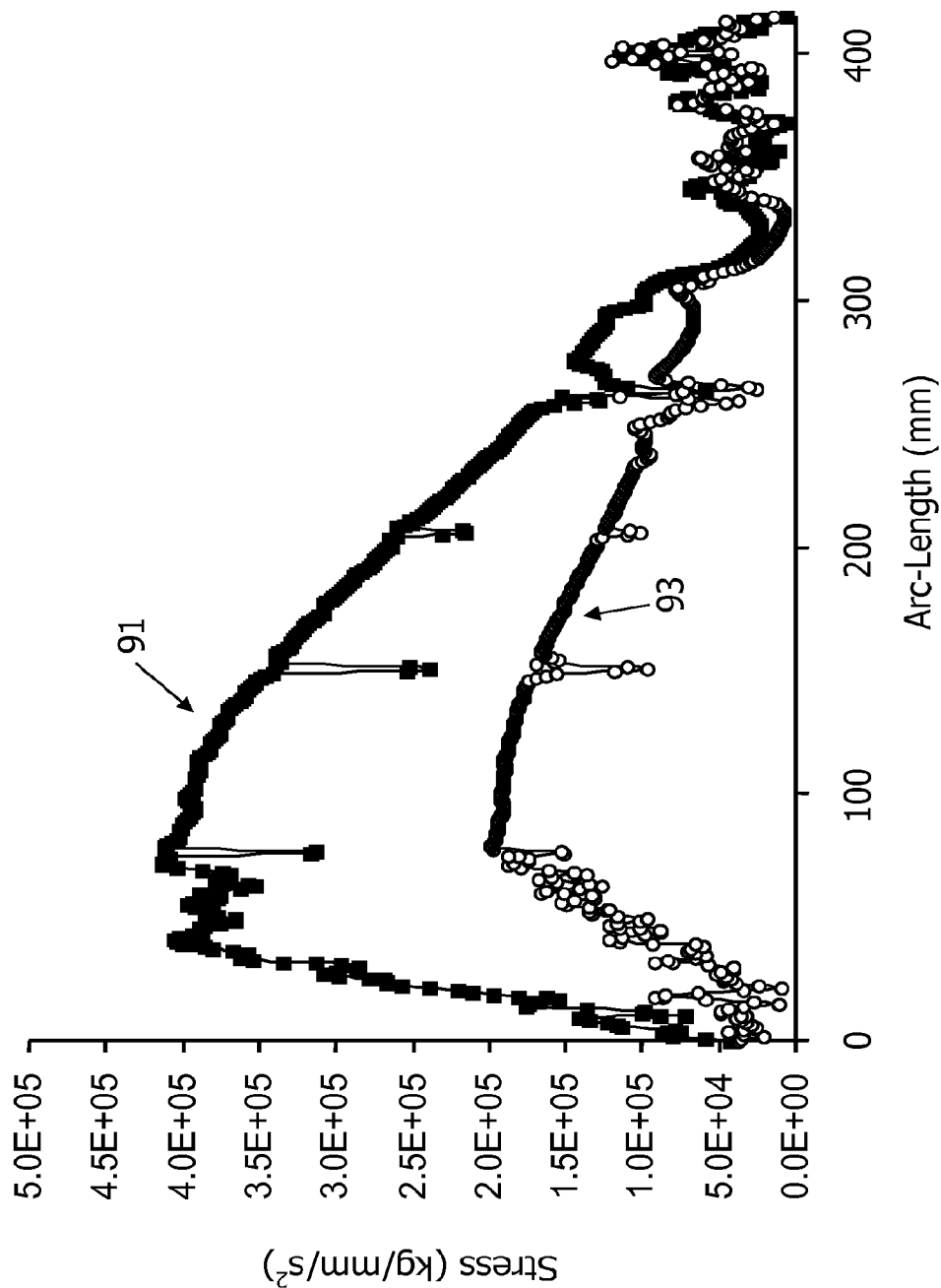
FIG. 18 is a graph similar to FIG. 16 comparing stresses in wafers resulting from lateral shift in combination with horizontal tilt of the grinding wheels.
Figure 19:
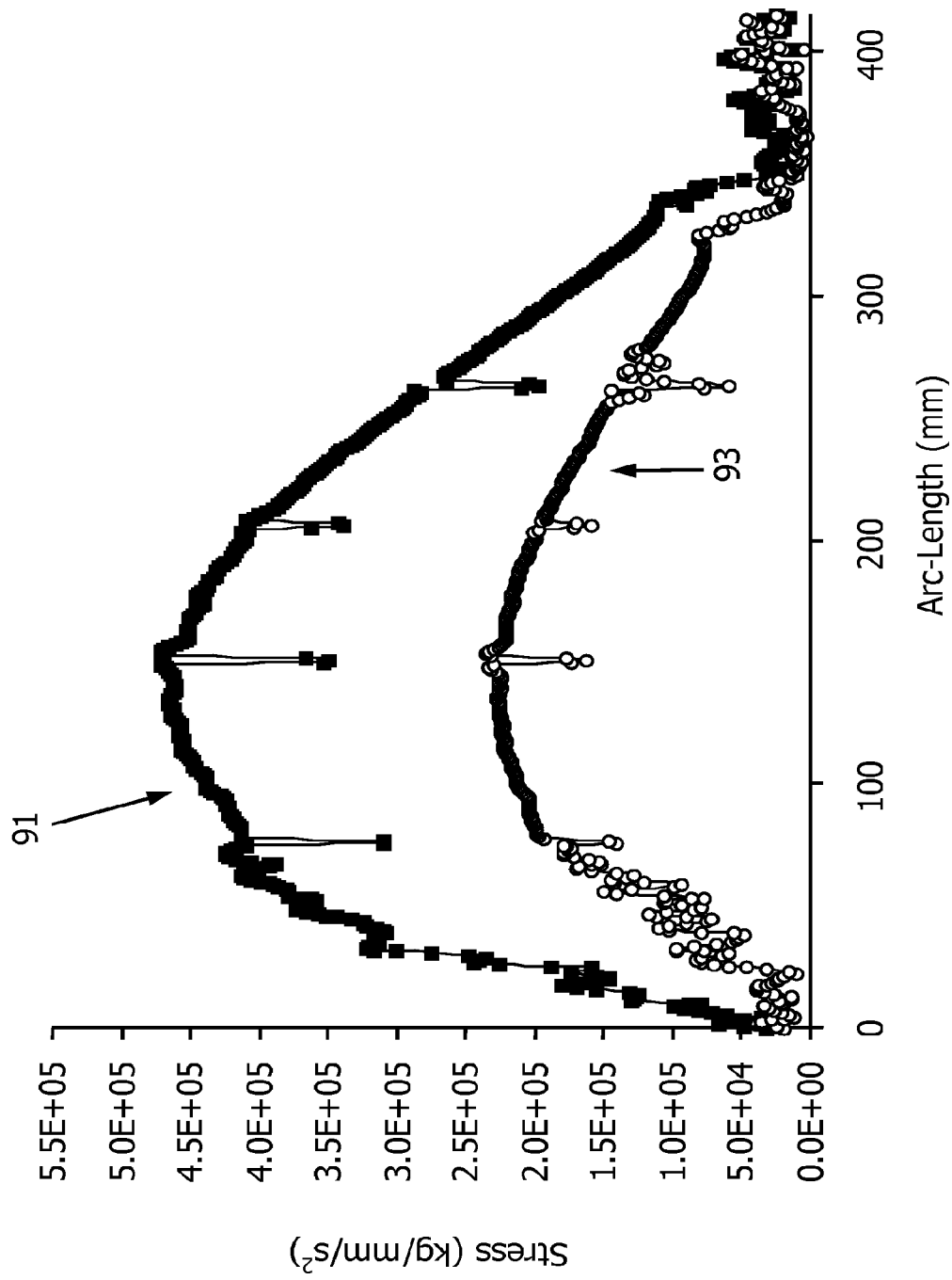
FIG. 19 is a graph similar to FIG. 16 comparing stresses in wafers resulting from the combined effect of lateral shift, vertical tilt, and horizontal tilt of the grinding wheels.

FIG. 18 illustrates stresses 91 and 93 in wafers W when the wheels shift and horizontally tilt. As can be seen, stresses 93 at the left side of the wafers W do not increase as sharply as do stresses 91. Accordingly, wafers W held by pads 11a and 11b do not bend as sharply at their peripheries when wheels 9a and 9b shift and horizontally tilt and B-ring and/or C-mark formation is reduced. Similar results are shown in FIG. 19 when stresses 91 and 93 in wafers W are caused by the combined effect of shift, vertical tilt, and horizontal tilt of grinding wheels.

Figure 20:
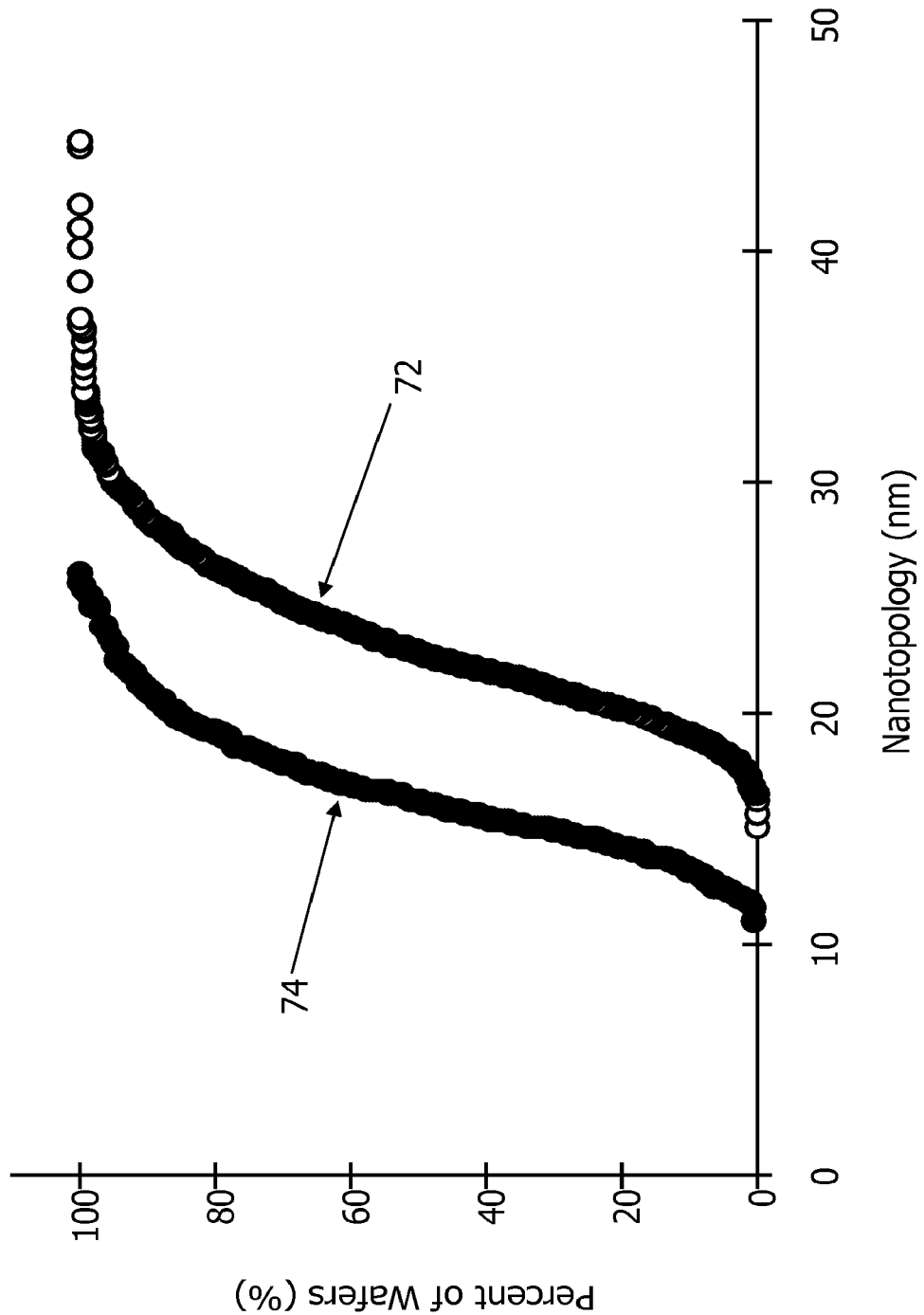
FIG. 20 is a graph comparing upper 0.05 percentile nanotopology values for wafers ground in a prior art wafer-clamping device to wafers ground in a wafer-clamping device of the invention.

FIG. 20 charts upper 0.05 percentile nanotopology values for wafers ground using hydrostatic pads 11' of the prior art and hydrostatic pads 11a and 11b of the invention. Nanotopology values for wafers ground using pads 11' are indicated generally by reference numeral 72, and values for wafers ground using pads 11a and 11b are indicated generally by reference numeral 74. The wafers ground using the pads 11a and 11b of the invention have consistently lower nanotopology values 74 than the values 72 of the prior art.

Hydrostatic pads 11a and 11b of the invention may be used to grind multiple wafers W in a set of wafers in a single operational set-up. A set of wafers may comprise, for example, at least 400 wafers. It may comprise greater than 400 wafers without departing from the scope of the invention. A single operational set-up is generally considered continual operation between manual adjustments of the grinding wheels 9a and 9b. Each ground wafer W of the set generally has improved nanotopology (e.g., reduced or eliminated center-mark (C-mark) and B-ring formation). In particular, they each have average peak to valley variations of less than about 12 nm. For example, the average peak to valley variations of the wafers may be about 8 nm. Average peak to valley variations represent variations over an average radial scan of each wafer W. Peak to valley variations are determined around a circumference of the wafer W at multiple radii of the wafer, and an average of those values is taken to determine the average variation.

Figure 21:
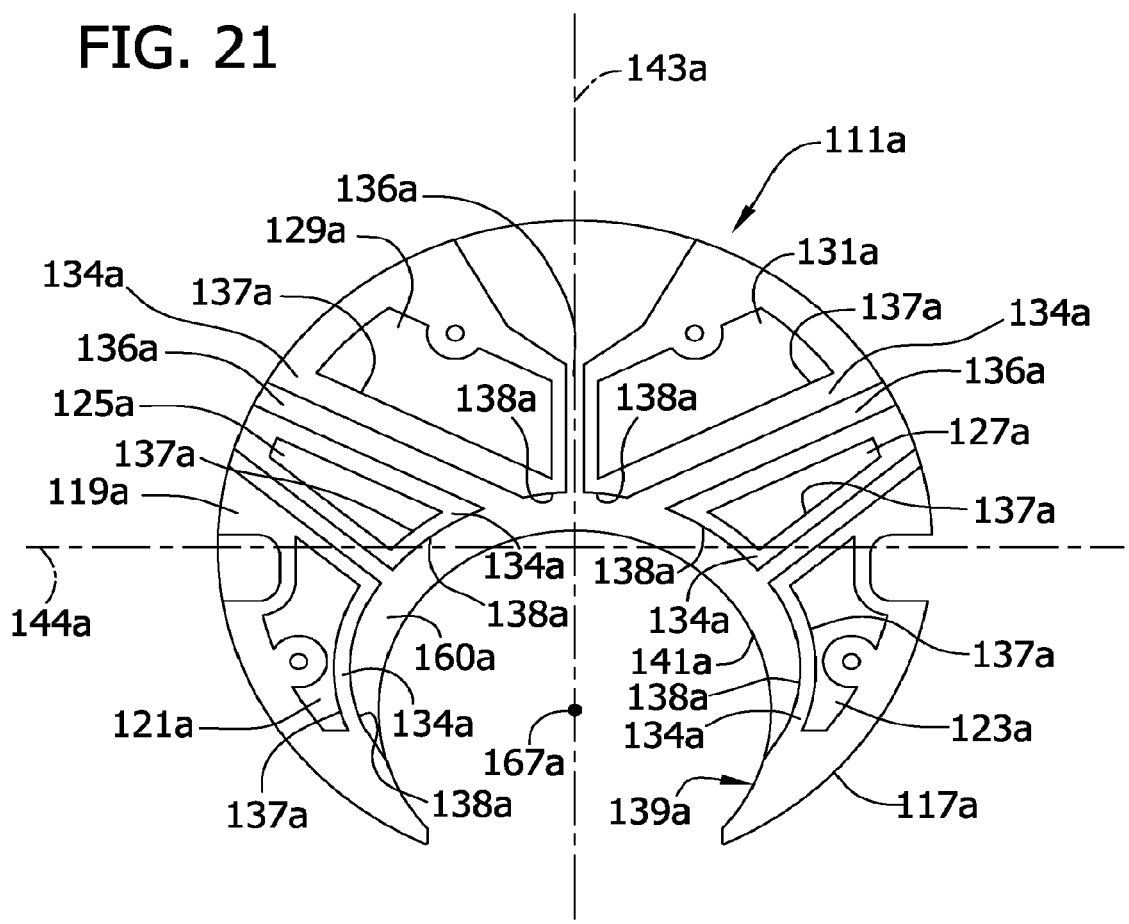
FIG. 21 is a schematic illustration of a hydrostatic pad according to a second embodiment of the invention, showing hydrostatic pocket configuration of a face of the pad opposing a semiconductor wafer during grinding.

FIG. 21 schematically illustrates a left hydrostatic pad according to a second embodiment of invention. The pad is designated generally by reference numeral 111a, and parts of this pad corresponding to parts of the pad 11a of the first embodiment are designated by the same reference numerals, plus "100". This hydrostatic pad 111a is substantially the same as the previously described hydrostatic pad 11a, but has hydrostatic pockets 121a, 123a, 125a, 127a, 129a, and 131a shaped and oriented differently than corresponding pockets 21a, 23a, 25a, 27a, 29a, and 31a in the pad 11a. Similar to pad 11a, the pockets 121a, 123a, 125a, 127a, 129a, and 131a are radially positioned about the grinding wheel opening 139a of the pad 111a, with pockets 121a and 123a, pockets 125a and 127a, and pockets 129a and 131a being similar and symmetrically located on opposite halves of the wafer side face 119a. Additionally, pockets 121a and 123a are elongated in a circumferential direction around the pad 111a. In this pad 111a, however, pockets 125a, 127a, 129a, and 131a are elongated radially away from the grinding wheel opening 139a. These pads 111a and 111b are the same as pads 11a and 11b in all other aspects.

It is additionally contemplated that a center of clamping of hydrostatic pads could be affected by controlling the pressure of the water applied to pockets of the hydrostatic pads. This would lower the center of clamping, moving it closer to a rotational axis of grinding wheels of a wafer-clamping device. More specifically, the fluid pressure in each pocket (or some subset of pockets) could be changed during the course of grinding and/or controlled independently of the other pocket(s). One way of varying the pressure among the several pockets is by making the sizes of the orifices opening into the pockets different. Moreover, the stiffness of the region associated with each pocket can be varied among the pockets by making the depth of the pockets different. Deeper pockets will result in a more compliant hold on the wafer W in the region of the deeper pocket than shallower pockets, which will hold the wafer stiffly in the region of the shallower pocket.

The hydrostatic pads 11a, 11b, 111a, and 111b illustrated and described herein have been described for use with a wafer W having a diameter of about 300 mm. As previously stated, a hydrostatic pad may be sized on a reduced scale for use to grind a 200 mm wafer without departing from the scope of the invention. This applies to each of the hydrostatic pad dimensions described herein.

The hydrostatic pads 11a and 11b of the invention are made of a suitable rigid material, such as metal, capable of supporting the wafer W during grinding operation and of withstanding repeated grinding use. Hydrostatic pads made of other, similarly rigid material do not depart from the scope of the invention.

According to another aspect of the invention, a system for assessing nanotopology begins providing feedback on the wafer nanotopology while the wafer is in the double side grinder. The nanotopology assessment system comprises at least one sensor configured to collect information about the position and/or deformation of the workpiece while the workpiece is held in the double side grinder. The sensor is operable to take one or more measurements that are used to define one or more boundary conditions for use in a finite element structural analysis of the wafer. It is understood that the system may have only a single sensor that takes a single measurement used to define a single boundary condition without departing from the scope of the invention (as long as there are enough boundary conditions to perform the finite element analysis, including any boundary conditions that can be defined or assumed without use of sensors). In some embodiments, however, the one or more sensors take a plurality of measurements used to define multiple boundary conditions, recognizing that it is often desirable (or necessary), to define additional boundary conditions for the finite element structural analysis of the wafer.

Figure 22:
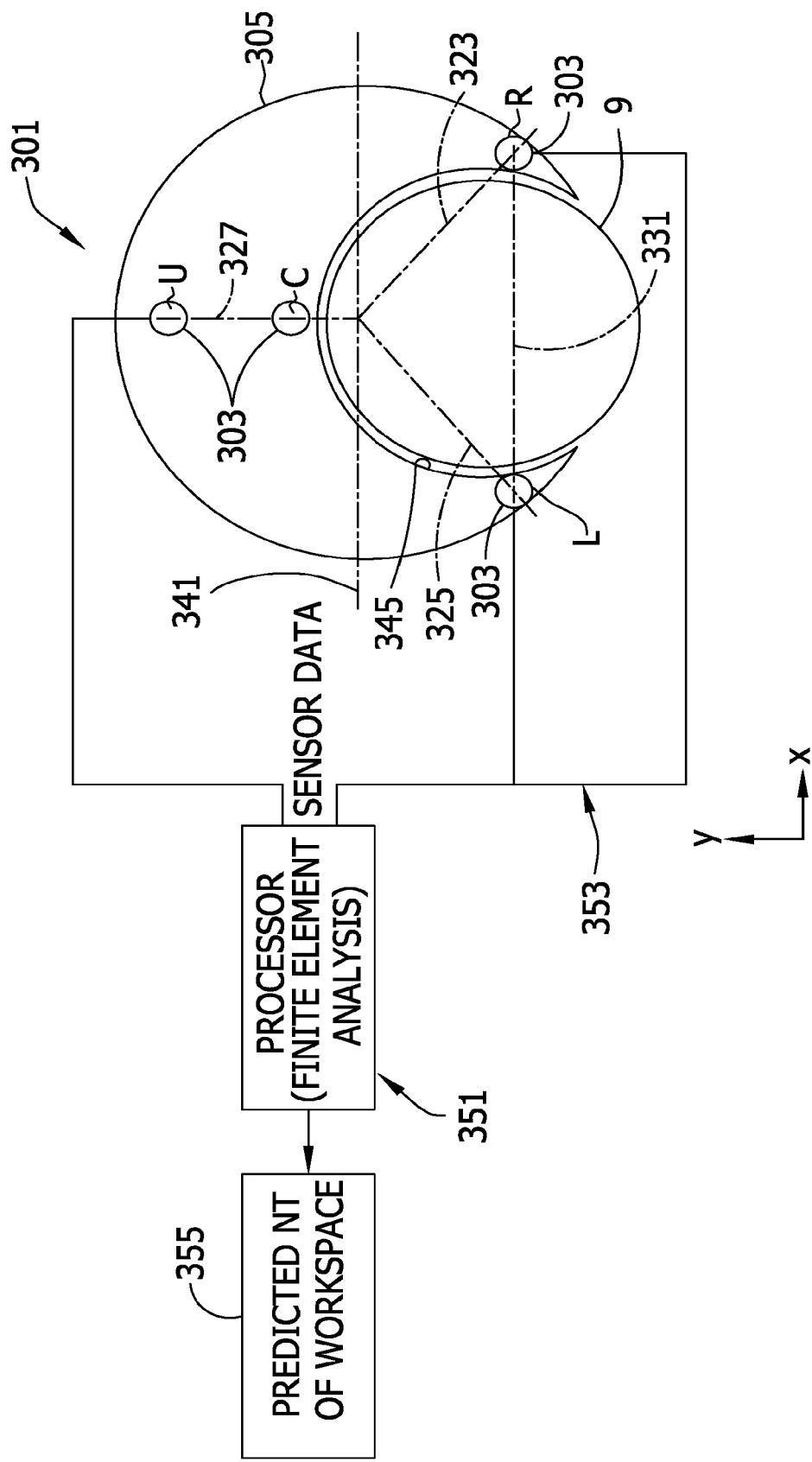
FIG. 22 is a schematic front elevation partially in block diagram form of a nanotopology system of the present invention.
Figure 23:
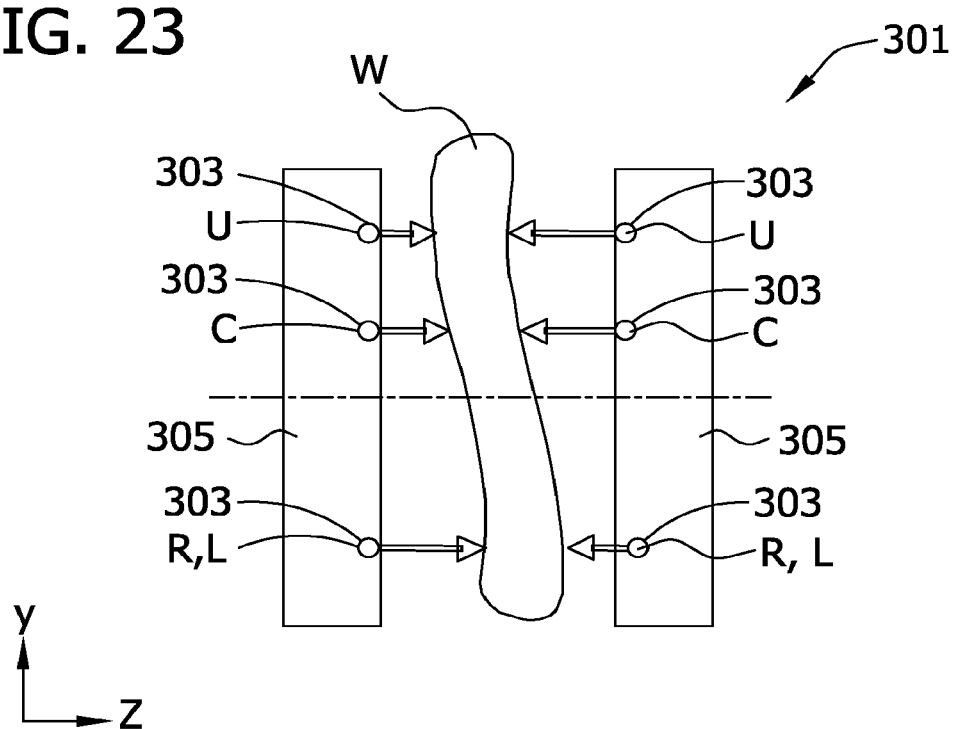
FIG. 23 is a schematic side view of the nanotopology assessment system.

For example, one embodiment of a nanotopology assessment system of the present invention, generally designated 301, is shown schematically in FIGS. 22 and 23. Although this embodiment is described in combination with a double side grinder having a particular hydrostatic pad configuration (as is evident in FIGS. 25A and 25B, which are discussed below), it is understood that the nanotopology assessment system is suitable for use with other double side grinders (having different workpiece clamping systems) without departing from the scope of the invention. Further, the invention is not limited to the nanotopology system itself, but also encompasses a double side grinding apparatus equipped with a nanotopology assessment system of the present invention.

One or more sensors 303 (e.g., a plurality of sensors) are positioned at the inner surfaces of the hydrostatic pads 305. In the particular embodiment shown in the drawings, for instance, a plurality of sensors 303 (e.g., four) are positioned along the inner working surface of each of the hydrostatic pads 305 (FIG. 23). Any type of sensor that is capable of collecting information that can be used to define a boundary condition for a finite element structural analysis of the wafer can be used. For example, in one embodiment the sensors 303 comprise dynamic pneumatic pressure sensors that measure distance between the hydrostatic pad and the wafer W by measuring resistance faced by pressurized airflow out of a nozzle impinging on the wafer (e.g., manufactured by MARPOSS Model E4N). The pressurized air is exhausted to the air. Such nozzles can be rigidly attached to the hydrostatic pads 305 or otherwise fixed relative to the hydrostatic pads. As those skilled in the art will recognize, measurements from such dynamic pressure sensors 303 are indicative of the spacing between the hydrostatic pads 305 and the surface of the wafer W. Accordingly, measurement of pressure by a dynamic pneumatic pressure sensor corresponds to distance between the sensor 303 and the surface of the wafer W.

The sensors 303 of the nanotopology assessment system associated with each of the hydrostatic pads 305 are spaced apart from the other sensors associated with that hydrostatic pad in at least one of an x direction and a y direction of an x, y, z orthogonal coordinate system (FIGS. 22 and 23) defined so that the wafer W is held in the x, y plane. Spacing the sensors 303 apart in this manner facilitates use of one sensor to take a measurement corresponding to one location on the surface of the wafer W while another sensor takes a measurement corresponding to a different location on the surface of the wafer.

Further, each of the hydrostatic pads 305 of the embodiment shown in the drawings has the same number of sensors 303 and the distribution of sensors in one of the pads is substantially the mirror image of the distribution of sensors in the other pad. Consequently, both hydrostatic pads 305 have sensors 303 that are spaced apart in at least one of the x direction and the y direction of the x, y, z coordinate system. Moreover, when the hydrostatic pads 305 are positioned in opposition to one another as shown in FIG. 23 (e.g., when the grinder is in use), the sensors 303 are arranged in pairs, with each sensor in one hydrostatic pad being paired with a sensor in the other hydrostatic pad. The sensors 303 in a sensor pair are generally aligned with each other in the x and y directions, being spaced apart from each other in substantially only the z direction of the x, y, z coordinate system. The sensors 303 in a sensor pair are positioned on opposite sides of the wafer W held by the hydrostatic pads 305, facilitating the taking of simultaneous measurements on opposite sides of the wafer at the same location. This allows the positions of the surfaces on both sides of the wafer W at that location to be determined simultaneously.

The number and arrangement of sensors 303 may vary. In general, those skilled in the art will recognize that there may be an advantage to having a greater number of sensors 303 because they could be used to obtain more measurements and define a greater number of boundary conditions, thereby reducing uncertainty in the results of the finite element analysis for wafer deformation at the areas between the boundary conditions. However, there is also a practical limit to the number of sensors 303. For example, it is desirable that the sensors 303 have minimal impact on the clamping function of the hydrostatic pads 305 and vice-versa. In the nanotopology assessment system 301 shown in the drawings, for instance, the sensors 303 are positioned at the plateaus 311 of the hydrostatic pads 305 rather than at the hydrostatic pockets 313. (Positions corresponding to the plateaus 311 and hydrostatic pockets 313 are shown on FIG. 25A, which is a map of boundary conditions derived from wafer clamping conditions.) This provides some separation between the sensors 303 and the areas of the wafer W clamped by the hydrostatic pockets 313, for which it is possible to derive boundary conditions from knowledge of the clamping conditions. The separation between the sensors 303 and the pockets 313 can also reduce the impact of local influences of the hydrostatic pockets on the sensor measurements.

As noted above, the sensors 303 are positioned to take measurements at different parts of the wafer W. For instance, some sensors 303 are positioned to take measurements that can be correlated with the central portion of the wafer W, while other sensors are positioned to take measurements at the portion of the wafer that is vulnerable to B-ring and/or C-mark defects. Referring to the particular sensor configuration shown in FIGS. 22 and 23, the sensors 303 are positioned to take measurements at a plurality of different distances from the center of the wafer W. At least one sensor (e.g., the plurality of sensors in the sensor pair designated C) is positioned near the center of the wafer W during grinding where it can take measurements related to deformation of the central portion of the wafer. At least one other sensor (e.g., the plurality of sensors in the sensor pairs designated R and L) is positioned near the peripheral portion of the wafer W (i.e., relatively far from the center of the wafer) during grinding. Still another sensor (e.g., the plurality of sensors in the sensor pair designated U) is positioned an intermediate distance from the center of the wafer W relative to the at least one sensor positioned near the periphery of the wafer and the at least one sensor positioned near the center of the wafer (e.g., near the portion of the wafer that is vulnerable to B-ring and/or C-mark defects).

The wafer W may flex in response to bending moments as it is rotated in the grinder. Consequently, the deformation of the wafer W at a given location on the wafer may change as the wafer rotates in the grinder. The sensors 303 are not only positioned to take measurements at different distances from the center of the wafer W, they are also positioned on different radial lines 323, 325, 327 extending from the center of the wafer. For instance, sensor pairs R and L are positioned to be about the same distance from the center of the wafer, but they are on different radial lines. The sensors in sensor pair R are generally on one radial line 323 and the sensors in sensor pair L are generally on another radial line 325 extending from the center of the wafer W in a different direction. Further, the sensors in sensor pairs C and U are positioned generally on a third radial line 327 extending from the center of the wafer W in yet another direction. In the embodiment shown in the drawings, the radial lines 323, 325, 327 are substantially equidistant from one another. Thus, the radial lines 323, 325, 327 form angles of about 120 degrees with one another. However, the spacing of the radial lines with respect to one another and the number of different radial lines along which sensors are positioned can vary without departing from the scope of the invention.

Moreover, sensors 303 are positioned at different locations with respect to components of the grinding apparatus. For example, the sensors in sensor pair L are on opposite sides of the grinding wheels 9 from the sensors in sensor pair R. This is evident in that an imaginary plane 331 (shown FIG. 22) that contains one of the sensors in sensor pair R and one of the sensors in sensor pair L and that is perpendicular to the x, y, plane of the coordinate system (defined above) intersects the grinding wheels 9. Because the sensors in sensor pairs R and L are positioned so they are about the same distance from the center of the wafer W, a portion of the wafer being subjected to measurement by one of the sensor pairs can later be subjected to measurement by the other sensor pair after rotation of the wafer brings that portion of the wafer to the other sensor pair. However, the measurements by the sensors in sensor pair R may be different from the corresponding measurements by the sensors in sensor pair L because the wafer W may flex as it rotates in the grinder.

Further, at least one sensor (e.g., the plurality of sensors in sensor pairs R and L) is positioned to be substantially below the horizontal centerline 341 (FIG. 22) of the wafer, while at least one other sensor (e.g., the plurality of sensors in sensor pair U) is positioned to be substantially above the horizontal centerline of the wafer. Another sensor (e.g., the plurality of sensors in sensor pair C) can be positioned to be relatively closer to the horizontal centerline 341 of the wafer W. In the embodiment shown in the drawings, for instance, the sensors in sensor pair C are slightly above the horizontal centerline 341 of the wafer W.

Moreover, at least one sensor (e.g., the plurality of sensors in sensor pairs R, C, and L) is positioned near one of the openings 345 in the hydrostatic pads 305 for receiving the grinding wheels 9 and, therefore, positioned to be adjacent the grinding wheels during operation. Similarly, at least one sensor (e.g., the plurality of sensors in sensor pairs R, C, and L) is positioned closer to the grinding wheels 9 than any of the hydrostatic pockets 313. As discussed above, grinder misalignment in some grinders can subject the wafer W to relatively higher stress at the transition between clamping by the grinding wheels 9 and clamping by the hydrostatic pads 305, in which case any sensors 303 positioned closer to the grinding wheels than any of the hydrostatic pockets 313 and/or positioned to be adjacent the grinding wheels during operation can be considered to be positioned to take measurements from a part of the wafer subjected to a relatively higher stress upon grinder misalignment. In this sense there may be some additional advantage to using hydrostatic pads 305 in which the hydrostatic pockets 313 are moved away from the grinding wheels 9 to move the center of the clamping force away from the grinding wheels (as described above) because this configuration of hydrostatic pockets allows more room for the sensors 303 of the nanotopology assessment system 301 to be positioned between the hydrostatic pockets and the grinding wheels (e.g., in the free regions of substantially zero clamping pressure).

At least one other sensor (e.g., the plurality of sensors in sensor pair U) is positioned to be farther from the openings 345 in the hydrostatic pads 305 and, therefore, positioned to be farther from the grinding wheels 9 in operation. That at least one sensor (e.g. the plurality of sensors in sensor pair U) is also farther from the grinding wheels 9 than at least some of the hydrostatic pockets 313. Further, that at least one sensor (e.g. the plurality of sensors in sensor pair U) can be considered to be positioned to take measurements from a part of the wafer W that subjected to relatively lower stress upon grinder misalignment in those grinders that subject the wafer to a relatively higher stress at the transition between clamping by the grinding wheels and clamping by the hydrostatic pads when there is misalignment.

As already noted, the sensors 303 are operable to detect information about the distance from the sensor to the wafer W surface. The sensors 303 are in signaling connection with a processor 351 (FIG. 22), which is operable to receive sensor data output from the sensors. The processor 351 can be remote from the grinding apparatus, but this is not required. Although FIG. 22 depicts hardwiring 353 connecting the processor 351 to the sensors, it is understood that the processor and sensors may be in wireless communication without departing from the scope of the invention.

Figure 24:
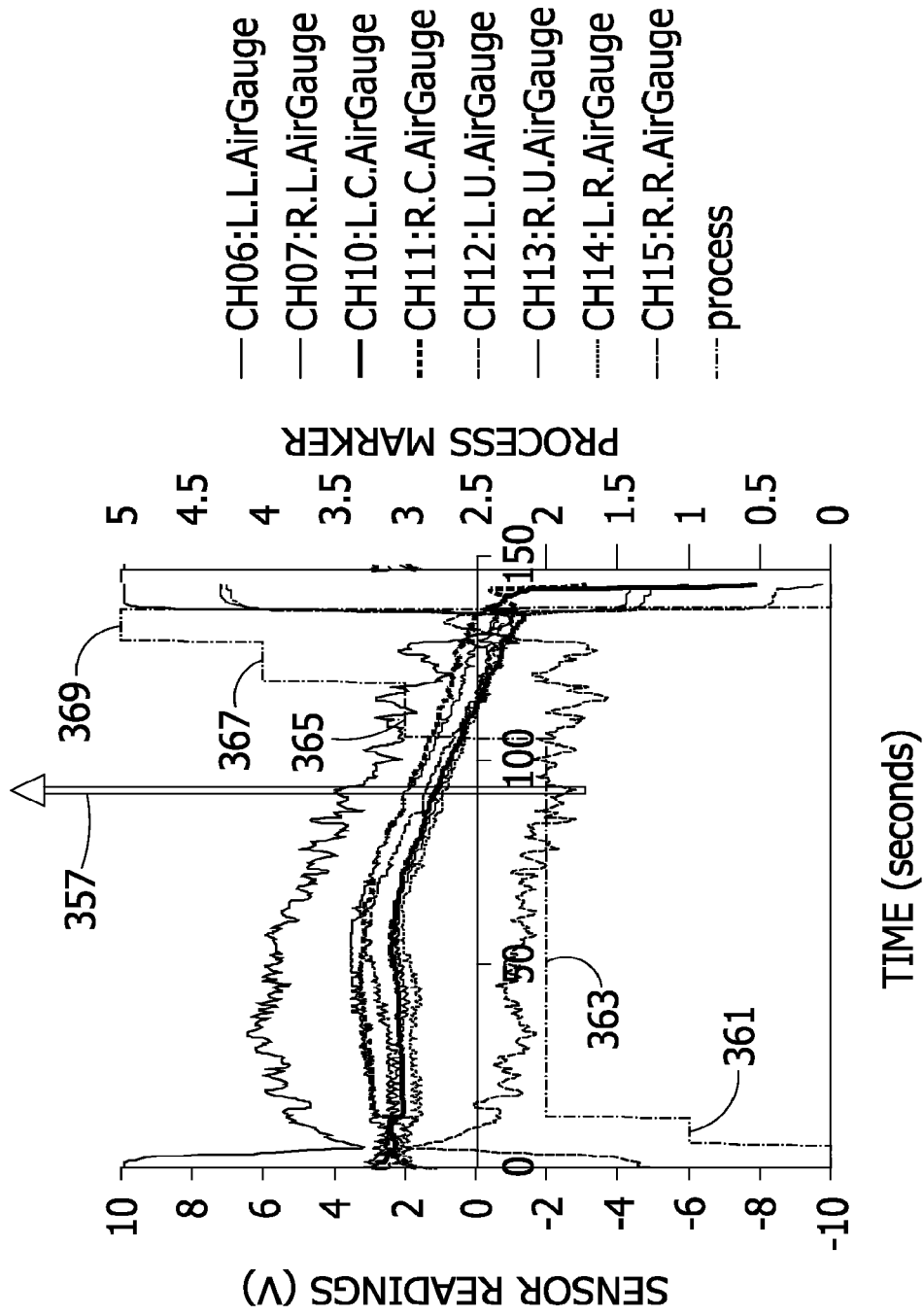
FIG. 24 is a graph showing output from a plurality of sensors of the nanotopology assessment system.

The CPU of a computer workstation can be used as the processor 351. Further, processing of data from the sensors 303 and/or information 355 derived therefrom can be shared between multiple processing units, in which case the word "processor" encompasses all such processing units. In one embodiment of the invention, the processor 351 monitors the sensor data output from the sensors 303 during the grinding operation. The output from the sensors 303 can be logged for information gathering purposes and/or to study the operation of the grinding apparatus. If desired, the output from the sensors 303 can be displayed graphically, as shown in FIG. 24, during and/or after the grinding operation.

In one embodiment of the invention, the processor 351 is operable to use the monitored sensor data from the sensors 303 to perform a finite element structural analysis of the wafer W. The processor 351 collects sensor data at a time 357 in the grinding operation, preferably near the end of the main grinding stage (e.g., before the finishing stages of grinding are initiated), as indicated in FIG. 24. The main grinding cycle corresponds to the second step indicated in FIG. 24. The complete grinding cycle shown in FIG. 24 consists of 5 steps: step 361=fast infeed; step 363=main grinding cycle; step 365=slow speed grinding cycle; step 367=spark=out cycle; and step 369=wheel retract cycle. The processor 351 is operable to determine one or more boundary conditions from the sensor data and to perform the finite element analysis of the wafer W using the one or more boundary conditions derived from the sensor data. The boundary conditions derived from the sensor data are supplemented with additional boundary conditions derived from knowledge of the clamping conditions created by the hydrostatic pads. The grinding cycle and the time at which the processor 351 collects data for the finite element structural analysis can vary without departing from the scope of the invention.

Figure 25A:
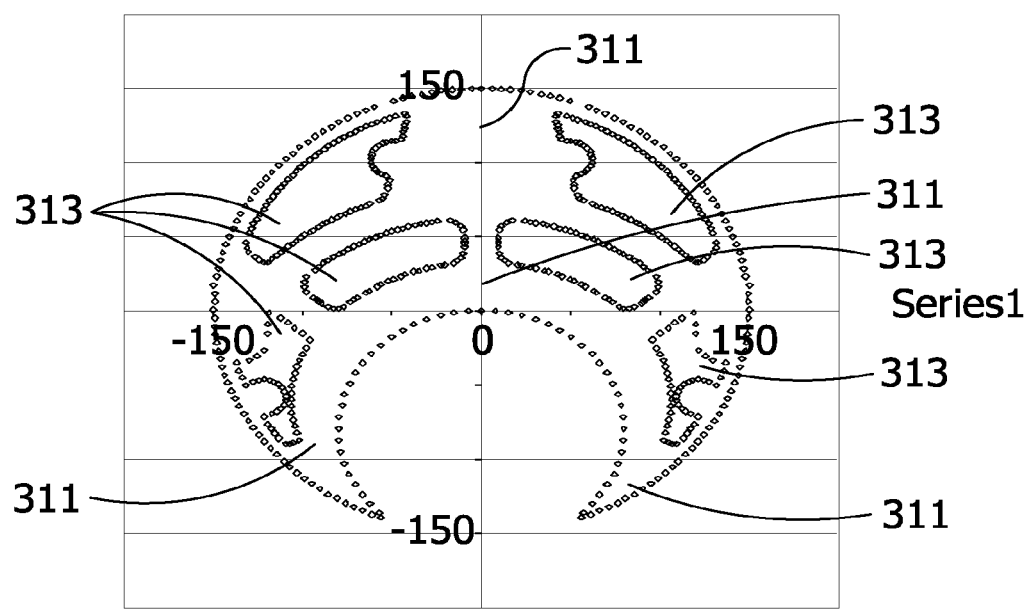
FIG. 25A is a schematic diagram of one example of locations at which boundary conditions for finite element analysis can be derived from knowledge of wafer clamping conditions.
Figure 25B:
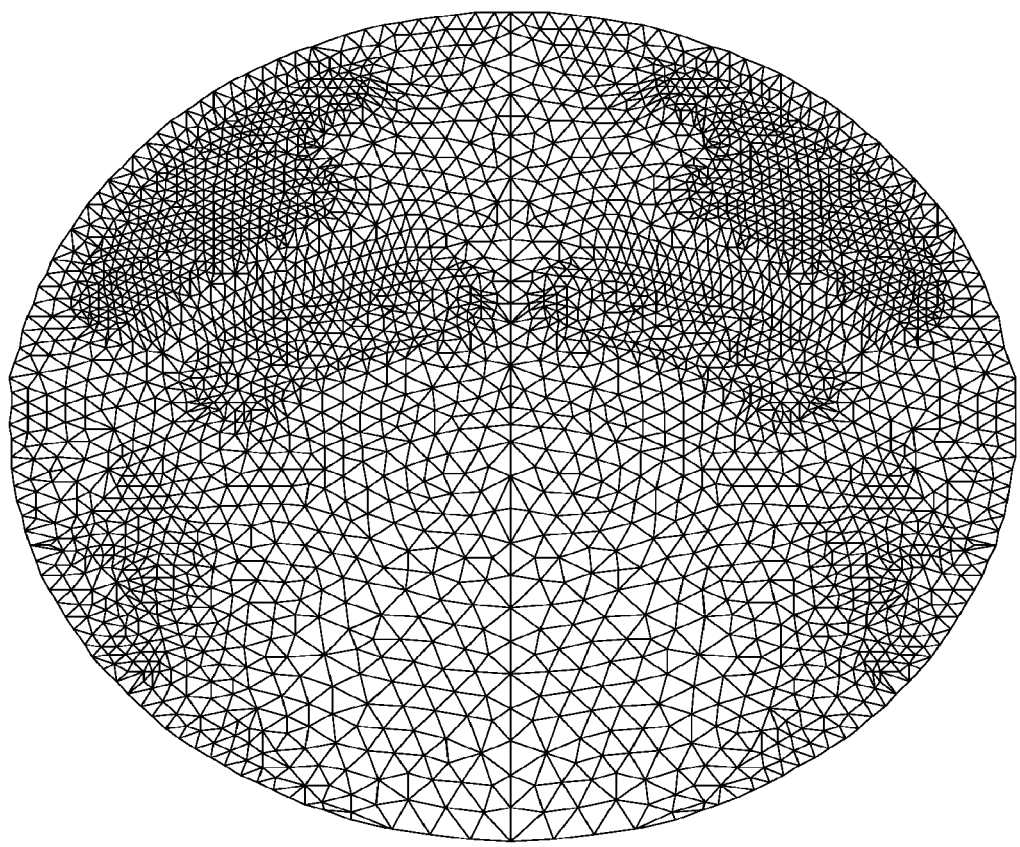

FIG. 25A shows one example of a set of locations for which boundary conditions can be derived from knowledge of the clamping conditions. In FIG. 25A, boundary conditions are defined around the perimeter of the hydrostatic pads 305 and also around the perimeters of the hydrostatic pockets 313. FIG. 25B shows a mesh suitable for performing a finite element structural analysis of the wafer W. Note that the hydrostatic pads 305 used in the example shown in FIGS. 25A and 25B have a slightly different hydrostatic pocket configuration than the hydrostatic pads 11a, 11b described above. However, those skilled in the art will know how to define boundary conditions and develop a mesh suitable for the particular hydrostatic pads being used in any grinding apparatus.

Figure 26A:
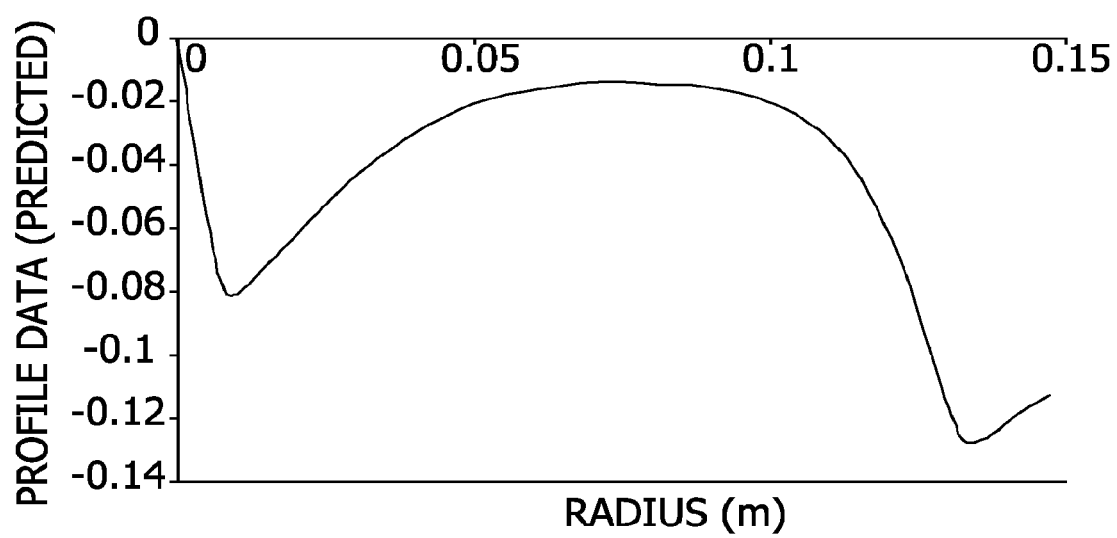
FIGS. 26A and 26B are nanotopology profiles of a wafer obtained with the nanotopology assessment system.

Using the boundary conditions derived from the sensor data, in combination with the boundary conditions derived from the clamping conditions, and properties of the wafer W (e.g., silicon's material properties) the processor 351 performs a finite element analysis of the wafer to predict the shape of the wafer, including a prediction of wafer nanotopology. The shape of the wafer W predicted by the processor 351 in the finite element analysis is the raw wafer profile. Because the grinding process typically results in nanotopology features exhibiting radial symmetry, the raw wafer profile can be expressed in terms of deformation as a function of distance from the center of the wafer. One example of a raw wafer profile predicted by finite element analysis using sensor data is shown in FIG. 26A.

Figure 26B:
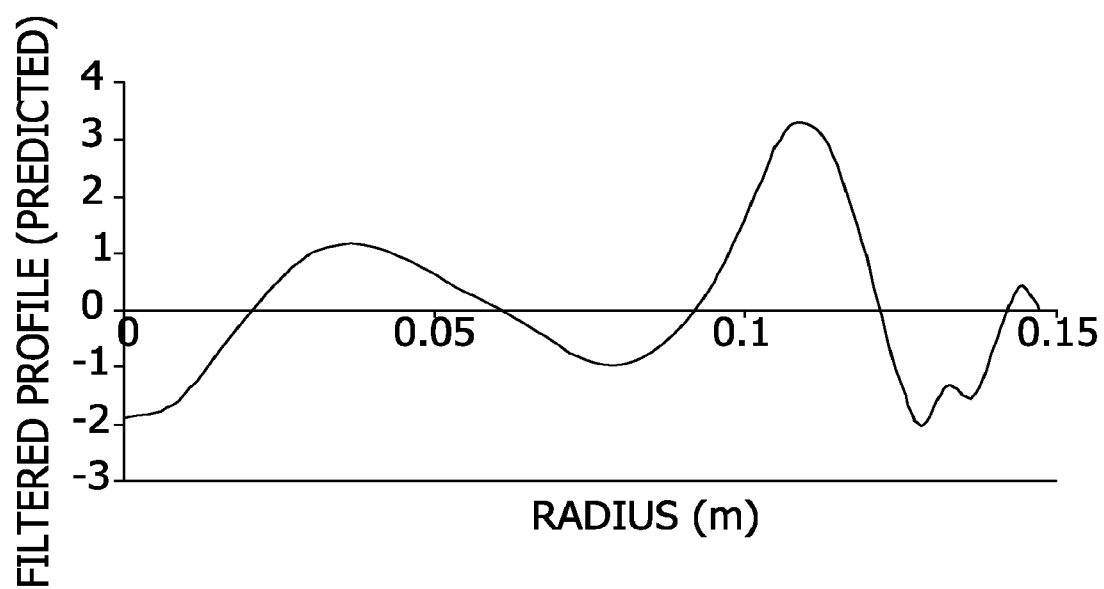

In one embodiment, the deformed wafer shape using finite element analysis is calculated as follows. A mesh using shell elements is identified for this analysis. The details of one mesh are illustrated in FIG. 25A. It should be kept in mind that the wafer deformation is likely to be more at either the R or L B-Ring sensors depending on the wafer clamping angle, wheel tilts and shift. The higher deformation tends have a stronger correlation with the NT degradation. Therefore, to capture this effect the higher of the two readings R and L is applied at both locations. The wafer clamping due to hydrostatic pads is simulated using a foundation stiffness boundary condition. The post polishing NT is computed, usually in less than 10 seconds. The wafer displacement along the periphery of the grinding wheel (arc ABC in FIG. 25B) is considered. For every radius r extending from the center of the wafer, there are two points along the arc. The displacement at these two points can be determined based on the results of the finite element analysis and averaged to yield an average displacement at that radius. The average displacement can be plotted as a raw profile curve (FIG. 26A). Readings from the raw profile curve are then passed through the spatial filter to generate the filtered profile curve (FIG. 26B).

It will be appreciated by those skilled in the art that there are usually additional wafer processing steps after grinding. For instance, wafers are commonly polished after grinding. Further, nanotopology yield is determined not by the nanotopology after grinding, but after the downstream processing steps (which typically change the nanotopology of the wafer) are complete. Thus, in one embodiment of the invention, the processor 351 is operable to predict what the wafer nanotopology is likely to be after one or more downstream processing steps using the raw wafer profile derived in the finite element analysis.

For example, a spatial filter can be applied to the raw wafer profile to predict the wafer profile after one or more downstream processing steps (e.g., polishing). Those skilled in the art will be familiar with various wafer defect/yield management software tools that are available to perform this type of spatial filtering. Some examples include: Intelligent Defect Analysis Software from SiGlaz of Santa Clara, Calif.; iFAB software from Zenpire of Palo Alto, Calif.; Examinator software from Galaxy Semiconductor Inc.—USA of Waltham, Mass.; and Yieldmanager software from Knights Technology of Sunnyvale, Calif. The filtered wafer profile is representative of what the nanotopology is likely to be after further processing. One example of a filtered wafer profile is shown in FIG. 26b. By comparing the raw wafer profile derived from the finite element analysis to actual nanotopology measurements (e.g., from a Nanomapper®) after the downstream processing (e.g., after polishing) for a number of wafers, the parameters (e.g., boundary conditions related to hydrostatic clamping) used in the finite element analysis can be fine-tuned for better correlation.

Further, the processor 351 is operable to receive sensor data from the sensors and assess workpiece nanotopology from the sensor data. In one embodiment, the processor is optionally operable to provide information 355 (e.g., predicted NT of workpiece) to implement remedial action in response to a negative nanotopology assessment (e.g., as determined by the processor when one or more wafer profiles fails to meet specifications or other predetermined criteria). In its simplest form, information 355 directed to the remedial action may comprise outputting a signal directed to one or more human operators (e.g., a process engineer) that an adjustment should be made and/or that the grinding process needs attention. In response to the signal from the processor 351, the human operators may adjust the alignment (e.g., at least one of an angle corresponding to a horizontal tilt of the grinding wheels, an angle corresponding to a vertical tilt of the grinding wheels and a shift between the grinding wheels) of the grinder and/or the pressure of fluid supplied to the pockets of the hydrostatic pads to improve grinder performance. Alternatively or in addition, the operator may adjust the alignment by adjusting the initial settings of the grinder (e.g., the thumbrule for settings). The processor 351 may also provide other information 355 to implement some remedial actions, including adjusting a grinding process variable. For instance, the processor 351 can be operable to provide information 355 for indicating an adjustment to a position or application of at least one of the grinding wheels and/or the hydrostatic pads in response to the sensor data, and/or the center of clamping force on the wafer by adjusting the pressure of fluid supplied to the pockets 313. Likewise, the processor 351 can be responsive to operator input to control a set of actuators (not shown) that are used to adjust the position of at least one of the grinding wheels 9 and hydrostatic pads 305 to realign the grinder.

In one embodiment of a method of processing a semiconductor wafer according to the present invention, a semiconductor wafer W is loaded into a double side grinder having the nanotopology assessment system 301 described above. The actual grinding of the wafer W proceeds in a conventional manner except as noted herein. During the grinding process, the one or more sensors 303 collects data that is indicative of wafer W deformation and that can be used to derive one or more boundary conditions for a finite element structural analysis of the wafer. For example, the sensors 303 of the nanotopology assessment system 301 described above collect a plurality of distance measurements between the surface of the wafer W and the sensors. Further, the sensors 303 of the assessment system 301 collect data simultaneously from different parts of the wafer and at various locations with respect to the grinder components, as described above.

In one embodiment, the sensors measure the deviation of the two surfaces of the workpiece in terms of distance in a portion of the workpiece associated with B-ring defects, and the processor 351 is operable to receive such distance data from the sensors and assess B-ring defects in the workpiece nanotopology from the received sensor data. In another embodiment, the sensors measure the deviation of the two surfaces of the workpiece in terms of distance in a portion of the workpiece associated with C-Mark defects, and the processor 351 is operable to receive such distance data from the sensors and C-Mark defects in the workpiece nanotopology from the received sensor data.

The sensors 303 transmit sensor data to the processor 351, which receives and processes the sensor data. Output from the sensors 303 is optionally logged and/or graphically displayed as shown in FIG. 24 (during and/or after the grinding). The sensor data is used to assess nanotopology of the wafer W. In one embodiment of the method, the processor 351 records the sensor data from a time in the grinding process to assess nanotopology of the wafer W. For example, FIG. 24 shows the time-varying output of each of the sensors plotted alongside the steps 361, 363, 365, 367, 369 of a double side grinding process cycle. The processor 351 records the output from the sensors 303 at a point in the process cycle (e.g., the time indicated with arrow 357 in FIG. 24) to obtain a set of concurrent data from each of the sensors. The processor 351 uses that set of data to derive boundary conditions for performing the finite element structural analysis of the wafer W.

The processor 351 performs a finite element analysis of the wafer using the sensor-derived boundary conditions and any other boundary conditions (e.g., the boundary conditions derived from knowledge of the clamping conditions (FIG. 25A). The finite element analysis is used to generate a raw nanotopology wafer profile (FIG. 26B). The spatial filter described above is optionally applied to the raw wafer profile to predict the likely nanotopology of the wafer W after a downstream processing step (e.g., after polishing).

The processor 351 reviews the raw wafer profile and/or the filtered wafer profile to evaluate the performance of the grinder with respect to nanotopology demands. This evaluation may consider the raw wafer profile and/or filtered wafer profiles for other wafers in a batch to determine if the grinder nanotopology performance meets predetermined criteria. If the processor 351 determines that the grinder is not meeting the nanotopology criteria, the processor initiates remedial action. In one embodiment, the remedial action comprises signaling one or more human operators that the grinding apparatus need attention. A human operator then adjusts alignment of the grinding apparatus and/or adjusts the center of clamping, as described above. In another embodiment, the processor 351 implements remedial action in response to a negative nanotopology assessment and operator input. For example, the processor 351 can adjust the amount of hydrostatic pressure applied to one or more portions of the wafer W to adjust the center of clamping and/or adjust alignment of the grinder using one or more actuators under the control of the processor in response to operator input.

In another embodiment, remedial action comprises adjusting the grinding of subsequent workpieces. For example, the grinder may be operable to grind a first workpiece and then a second workpiece after grinding the first workpiece. The processor 351 is operable to receive data from the sensors and assess nanotopology of the first workpiece from the sensor data. Thereafter, the processor 351 is operable to provide information 355 for indicating an adjustment to the position of at least one of the grinding wheels and/or the hydrostatic pads in response to the sensor data for use when grinding a subsequent workpiece such as the second workpiece. In the situation where the workpiece is a cassette of several wafers, a finite element analysis may be performed for each wafer in the cassette and there is no need to wait until the entire cassette of wafers has been ground. If the settings are not proper and if an NT defect is detected in one or more of the wafers, then it is likely that other wafers in the cassette will have a similar or the same defect leading to larger yield loss without some form of intervention. According to one embodiment of the invention, the operator does not have to wait to get the feedback from all wafers in the cassette and avoids a considerable amount of yield-loss. Therefore, a reliable prediction of post-polishing NT defects during grinding is provided. Such a prediction helps the operator to optimize the grinder settings for subsequent wafers and cassettes such that the nanotopology defects after polishing of the subsequent wafers is minimal.

Figure 27:
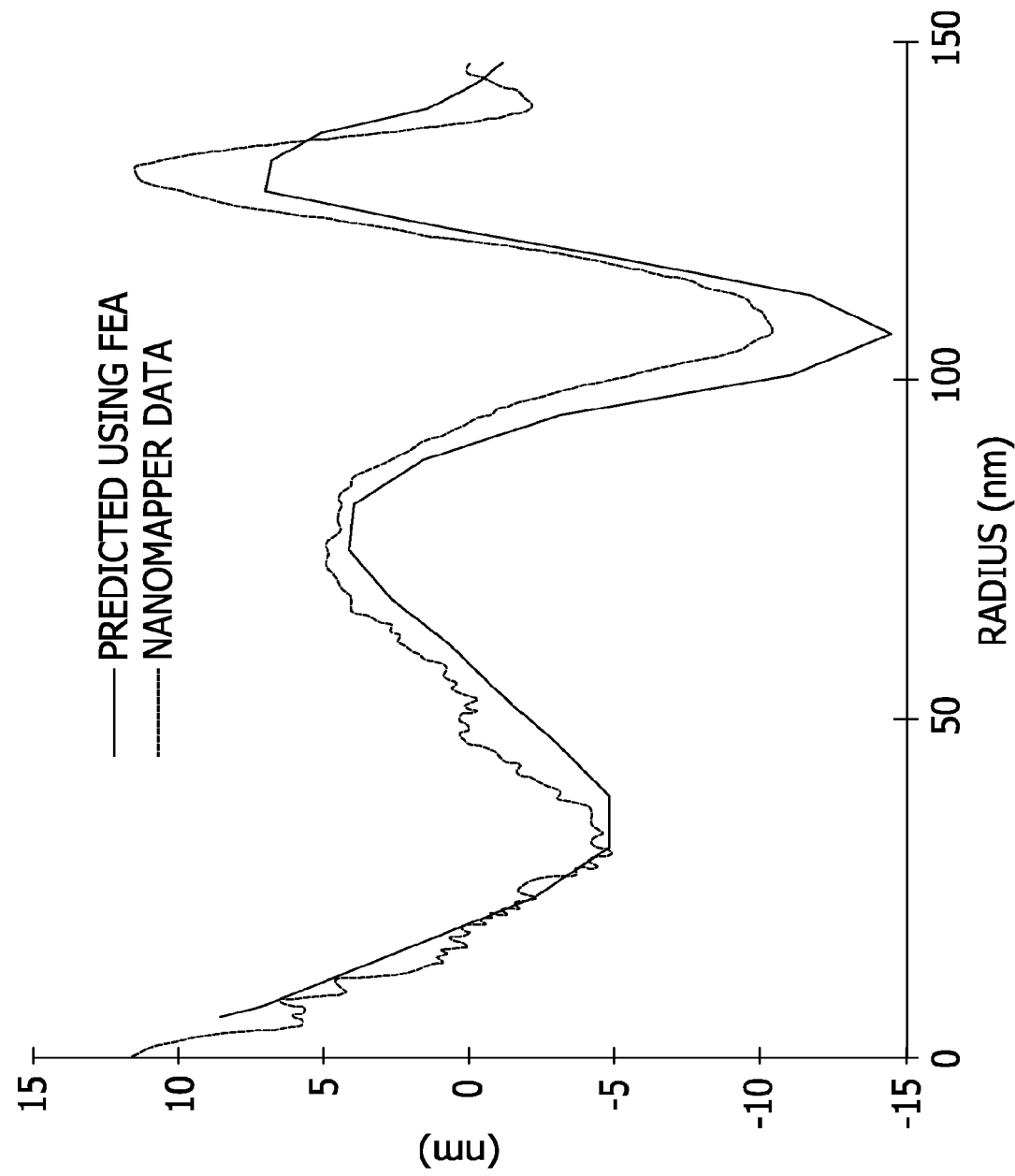
FIG. 27 is a graph illustrating the predicted profile according to one embodiment of the invention for a wafer and illustrating the average radial profile for that wafer after polishing, the average radial profile being obtained from a nanomapper.
Figure 28:
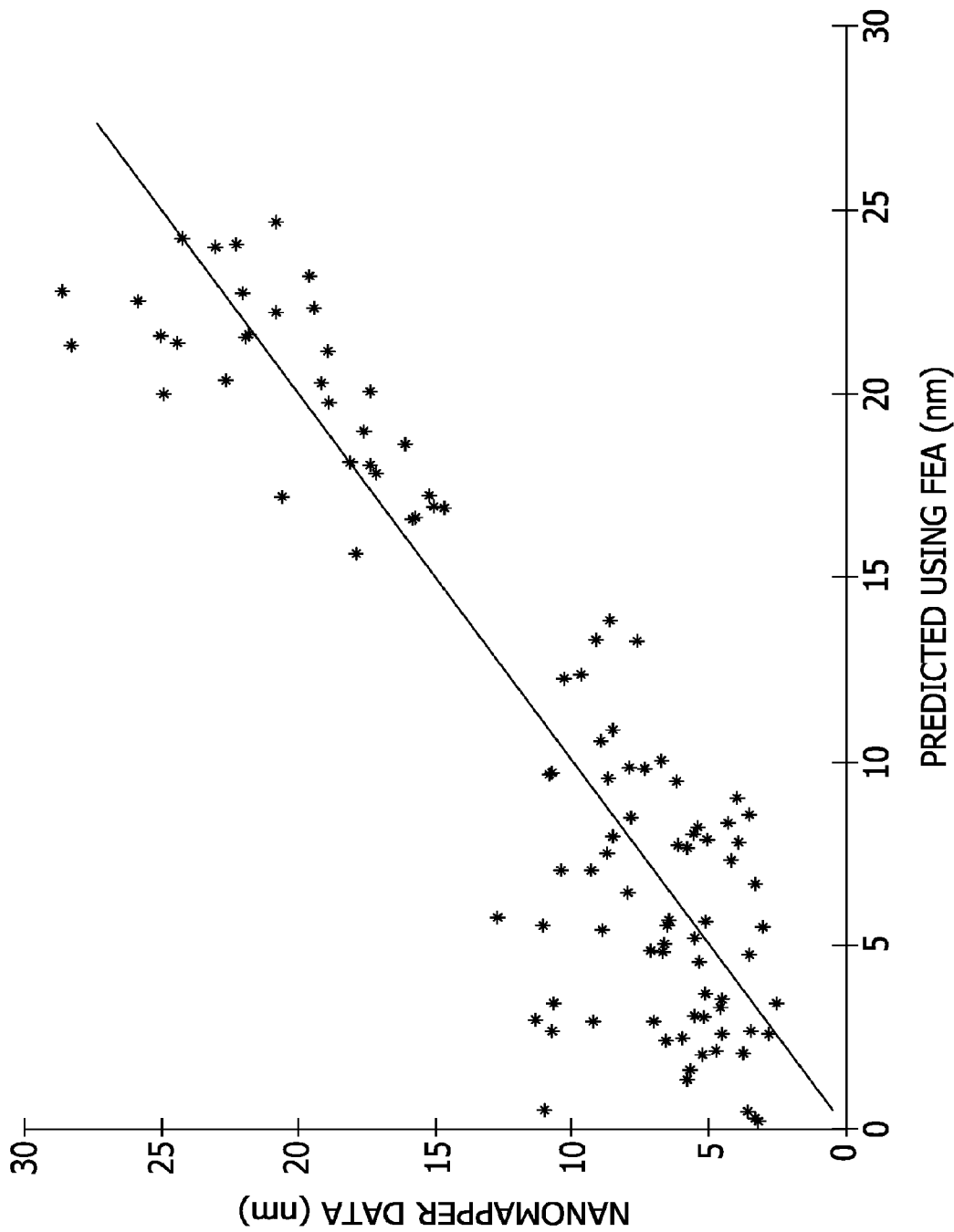
FIG. 28 is a graph illustrating the correlation between the predicted B-ring values of the wafer of FIG. 27 and the actual B-ring values of the wafer of FIG. 27, the correlation coefficient being R=0.9.

FIG. 27 is a graph illustrating the predicted profile according to one embodiment of the invention for a particular wafer and illustrating the average radial displacement profile for that same wafer after polishing, as determined by a nanomapper. The solid line illustrates one example of a predicted profile of the wafer based on finite element analysis, according to one embodiment of the invention. The dashed line illustrates the profile based on the data from a nanomapper which analyzed the wafer. FIG. 28 is a graph illustrating the correlation between the predicted B-ring values plotted on the horizontal axis of a number of wafers and the actual B-ring values plotted on the vertical axis, the correlation coefficient being R=0.9.

The method of the present invention provides rapid feedback on the nanotopology performance of the grinder. For instance, the evaluation of the wafer nanotopology can begin before the wafer grinding cycle is complete. Furthermore, nanotopology feedback can be obtained before polishing. In contrast, many conventional nanotopology feedback systems use laser inspection to measure wafer nanotopology. These systems are typically not compatible for use with an unpolished wafer lacking a reflective surface. Many other advantages attainable through the methods of the present invention will be recognized by those skilled in the art in view of this disclosure.

In the method described above, the sensors 303 collect data on a substantially continuous basis during the grinding operation. However, it is understood that data could be collected from the sensors after the grinding is complete while the wafer is still in the grinder. Further, the sensors 303 may take measurements intermittently or at a single point in time without departing from the scope of the invention. Likewise, processing of sensor data can begin or continue after the grinding operation is complete and/or after the wafer is removed from the grinder without departing from the scope of the invention.

Also, the embodiment of the nanotopology system described above is shown assessing nanotopology of a wafer while it is held vertically in a double side grinder, but it is understood that the nanotopology assessment system can be used to assess nanotopology of wafers held in different orientations (e.g., horizontal) without departing from the scope of the invention.

Although embodiments of the nanotopology assessment system described herein perform finite element analysis for each wafer to assess its nanotopology, those skilled in the art will recognize that empirical data from a number of such finite element analyses may be used to develop criteria allowing the processor to assess nanotopology without actually performing a finite element structural analysis. For example, if sensor data for a wafer in the grinder is sufficiently similar to the sensor data for another wafer for which a finite element analysis was performed, the results of the previous finite element analysis can be used to assess nanotopology of the wafer in the grinder without actually performing a finite element analysis of the wafer that is in the grinder. Databases and learning routines can be used to augment this process, thereby reducing or eliminating instances in which the processor performs a finite element analysis. It is also contemplated that experienced human operators of the nanotopology assessment system may develop the ability to recognize signatures indicative of nanotopology defects by viewing a graphical or other display of the sensor output and manually implement remedial action without departing from the scope of the invention.

Moreover, it is not essential that a nanotopology assessment be conducted for each wafer. If desired, nanotopology can be assessed as described herein for a subset of the wafers ground in a grinder (e.g., a sample for quality control) without departing from the scope of the invention.

Figure 29:
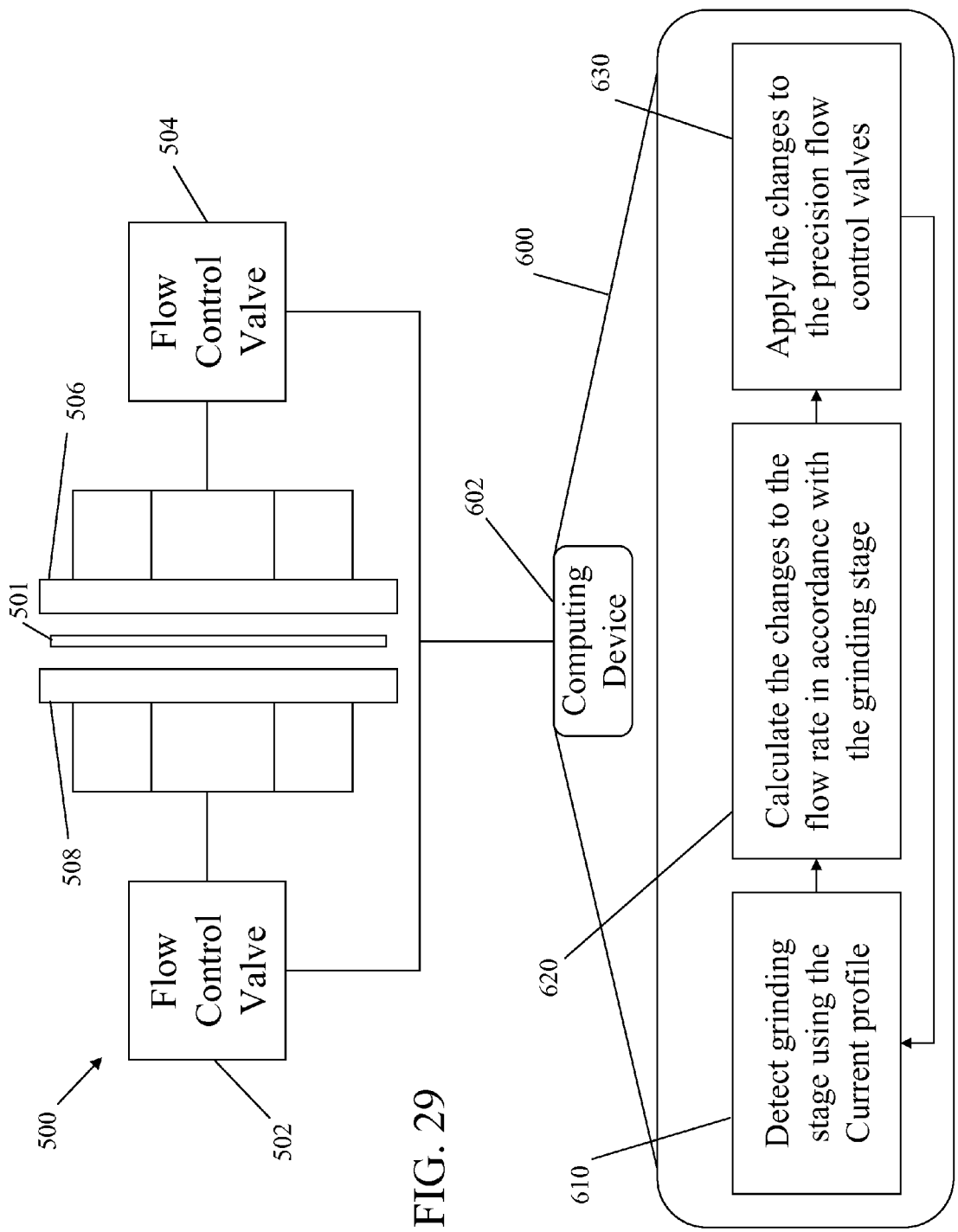
FIG. 29 is a schematic view of another embodiment of a wafer grinder.

Referring to schematic FIG. 29, another embodiment of a wafer grinder is shown and indicated generally at 500. The wafer grinder generally includes a first hydrostatic pad 506 and a second hydrostatic pad 508 positioned opposite the first hydrostatic pad. A wafer 501 (broadly, a workpiece) is positioned between the hydrostatic pads 506, 508. A pair of grinding wheels (not shown) is also included in the wafer grinder. The wafer grinder may be similar to those embodiments described above. However, the wafer grinder of FIG. 29 includes additional components to aid in the reduction of NT degradation of wafers processed by the wafer grinder.

A first flow control valve 504 controls the flow of water to the first hydrostatic pad 506 and a second flow control valve 502 controls the flow of water to the second hydrostatic pad 508. In this embodiment, hydrostatic pressure in the pads is controlled by water flow, though other modes are contemplated.

The flow control valves 502, 504 are any suitable valves that are capable of controlling the flow or pressure of water. For example, the flow control valves 502, 504 may be globe valves, ball valves, gate valves, diaphragm valves, needle valves, or any combination thereof. The flow control valves 502, 504 may be controlled by any suitable actuator (not shown), and they may be separately controlled.

A control system 600 controls the operation of the wafer grinder and the flow control valves 502, 504. The control system 600 includes a computing device 602 having a processor, one or more forms of computer readable media, and an input/output device. In some embodiments, the processor of the computing device 602 is operable to control the flow control valves 502, 504. The control system 600 is operable to measure the amount of electrical current used by the grinding wheels. The control system 600 may directly measure the current used by the grinding wheels or it may receive a signal or other communication from a separate monitoring device (not shown) that measures the current used by the grinding wheels.

Figure 30:
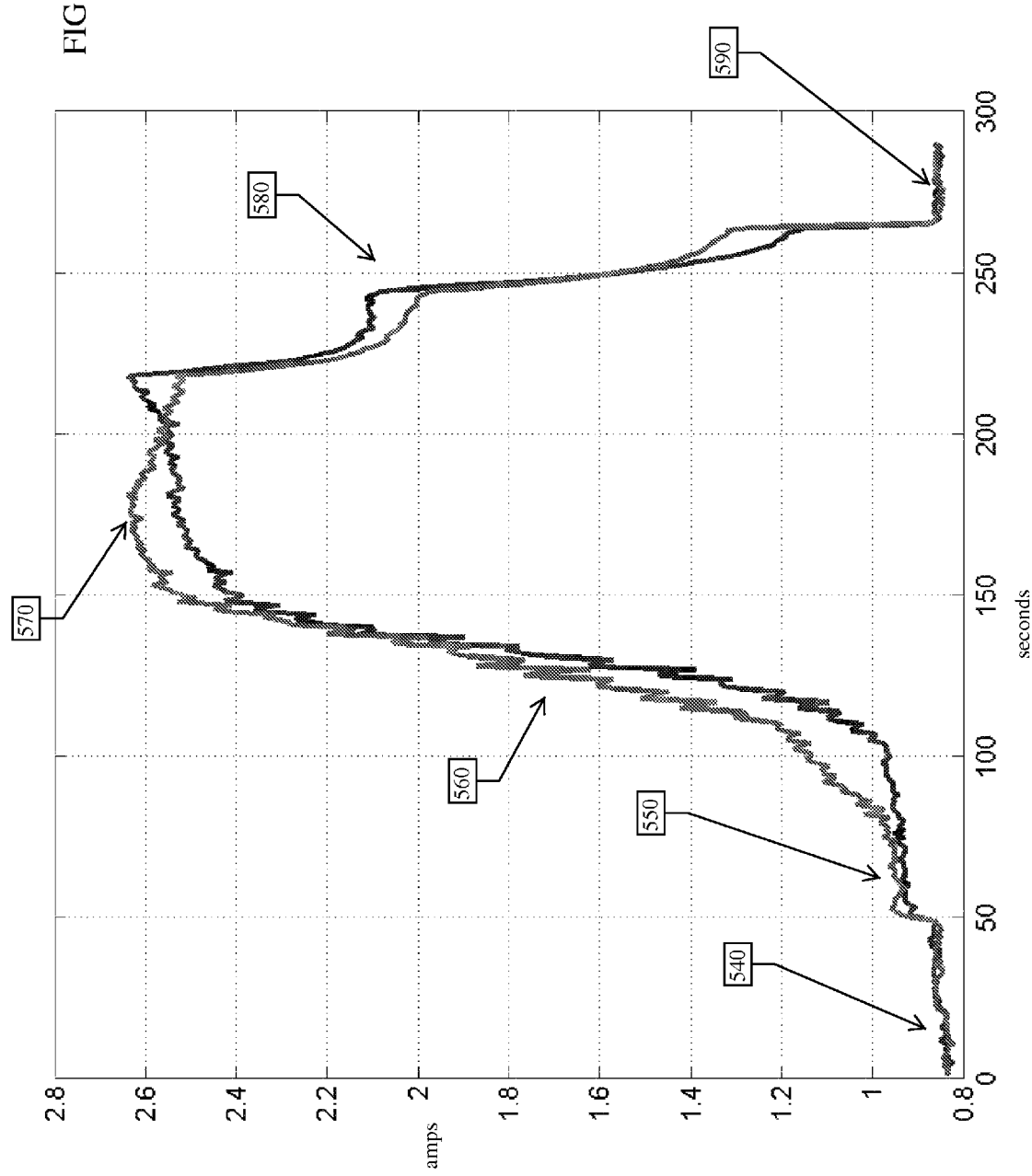
FIG. 30 is a graph of current drawn by grinding wheels of the grinder of FIG. 29.

The amount of electrical current used by the grinding wheels is indicative of the present stage of the grinding operation. For example, and as shown in FIG. 30, when the grinding wheels first touch the wafer 501, the current drawn by the grinding wheels increases slightly at an initial state indicated at 550 compared to a residual state indicated at 540. FIG. 30 shows the current drawn by each grinding wheel during the grinding operation. The current draw continues to increase as the grinding wheels attempt to grip the wafer 501, as shown along the section indicated at 560. During this stage there is relatively little removal of material from the wafer 501. As the current draw reaches its peak at section indicated at 570, the amount of material removed from the wafer 501 increases. The current draw stays at this peak level while most of the material is removed from the wafer 501 by the grinding wheels. During a spark out stage (when the grinding wheels begin to retract) indicated at 580 the current draw drops rapidly. After the grinding wheels fully retract the current draw drops back to the residual level indicated at 590.

The computing device 602 uses the monitored or sensed current draw of the grinding wheels to predict (i.e., detect or determine) the present stage of grinding operation. The computing device 602 makes this prediction with the aid of a pattern detection software program. The pattern detection software program includes computer executable instructions stored on the one or more forms of computer readable media on the computing device 602. The computer executable instructions are executed by the processor of the computing device 602.

The control system 600 is operable to control the pressure in the hydrostatic pads 506, 608 using the flow control valves 502, 504 based on the stage of grinding determined by the pattern detection software. To minimize NT degradation, the control system 600 increases the pressure in the hydrostatic pads during the grinding stages at the beginning and end of the grinding process. At these grinding stages, the current draw of the grinding wheels is at its lowest. The control system 600 thus controls the flow control valves 502, 504 such that the valves increase the flow rate of water input to the hydrostatic pads 506, 508 and thus increase the pressure in the hydrostatic pads.

During the grinding stage or stages that remove most of the material from the wafer 501, the control system 600 controls the flow control valves 502, 504 to decrease the flow rate of water input to the hydrostatic pads 506, 508 and thus decrease the pressure in the hydrostatic pads. During this grinding stage, the grinding wheels support the wafer 501 and grip the wafer between the grinding wheels. By decreasing the pressure in the hydrostatic pads 506, 508 during this grinding stage, the amount of elastic deformation that the wafer is subjected to is dramatically decreased or eliminated. This reduction or elimination of elastic deformation in the wafer 501 results in reduced NT on the surface of the wafer 501.

In operation, the control system 600 thus performs a method where in block 610 the grinding stage is detected (i.e., determined) using the pattern detection software. In block 620, changes to the flow rate are calculated in accordance with grinding stage detected in block 610 by the pattern detection software. The control system 600 then applies these changes by controlling the flow control valves 502, 504 in block 630. The control system 600 is thus operable to modulate the hydrostatic pressure.

The control system 600 is also operable to perform another method where a first hydrostatic pressure is established in the hydrostatic pads 506, 508 to initially clamp the wafer 501 between the pads. In this method, the wafer 501 is held in a substantially vertical plane. The hydrostatic pressure in the hydrostatic pads 506, 508 is then reduced with the flow control valves 502, 504 to a second hydrostatic pressure lower than the first pressure during grinding of the wafer 501. During grinding of the wafer 501, the wafer 501 may be substantially clamped by the grinding wheels. The hydrostatic pressure is then increased to a third hydrostatic pressure to clamp the wafer and to thereby improve nanotopology in the wafer 501. The third hydrostatic pressure may be substantially equal to the first hydrostatic pressure.

According to another method, the control system 600 performs a method including the stages of clamping the wafer, grinding the wafer, and removing the wafer from contact with the grinding wheels. The wafer is held in a substantially vertical plane. The pattern detection software is used to detect each stage of the grinding operation and changes the hydrostatic pressure at each stage to change the clamping pressure applied to the wafer to thereby improve nanotopology in the processed wafer. The hydrostatic pressure of this embodiment is changed by changing the flow rate through the flow control valves 502, 504, though other ways of changing the pressure are contemplated. In the example embodiment, the pressure is decreased in the grinding stage. In other embodiments, the pressure is increased during the grinding stage.

EXAMPLE

Two data sets were obtained by measuring the surfaces of a first set of wafers and a second set of wafers. The tested wafers were free from entrance and exit marks or other similar defects. The first set of wafers was ground according to a conventional process (i.e., a process of record or POR) where the hydrostatic pressure was not altered during the grinding stage. The second of set of wafers was ground according to the embodiment of FIG. 29 where the hydrostatic pressure was increased during the grinding stage. The surfaces of the tested wafers were measured according to the threshold height average for sections (e.g., 10 mm×10 mm sections) of the surfaces (i.e., a THA1010 measurement standard). Measurements taken according to the THA1010 measurement standard indicate the maximum peak to valley vertical distance within a section of the surface of the wafer. Multiple such measurements are taken across the surface of the wafer at different sections (although the sections can overlap). The THA1010 measurement standard is a known measurement standard used to evaluate the nanotopology of wafers surface. Using the standard, the lower the number, the better the nanotopology of the wafer surface.

Figure 31:
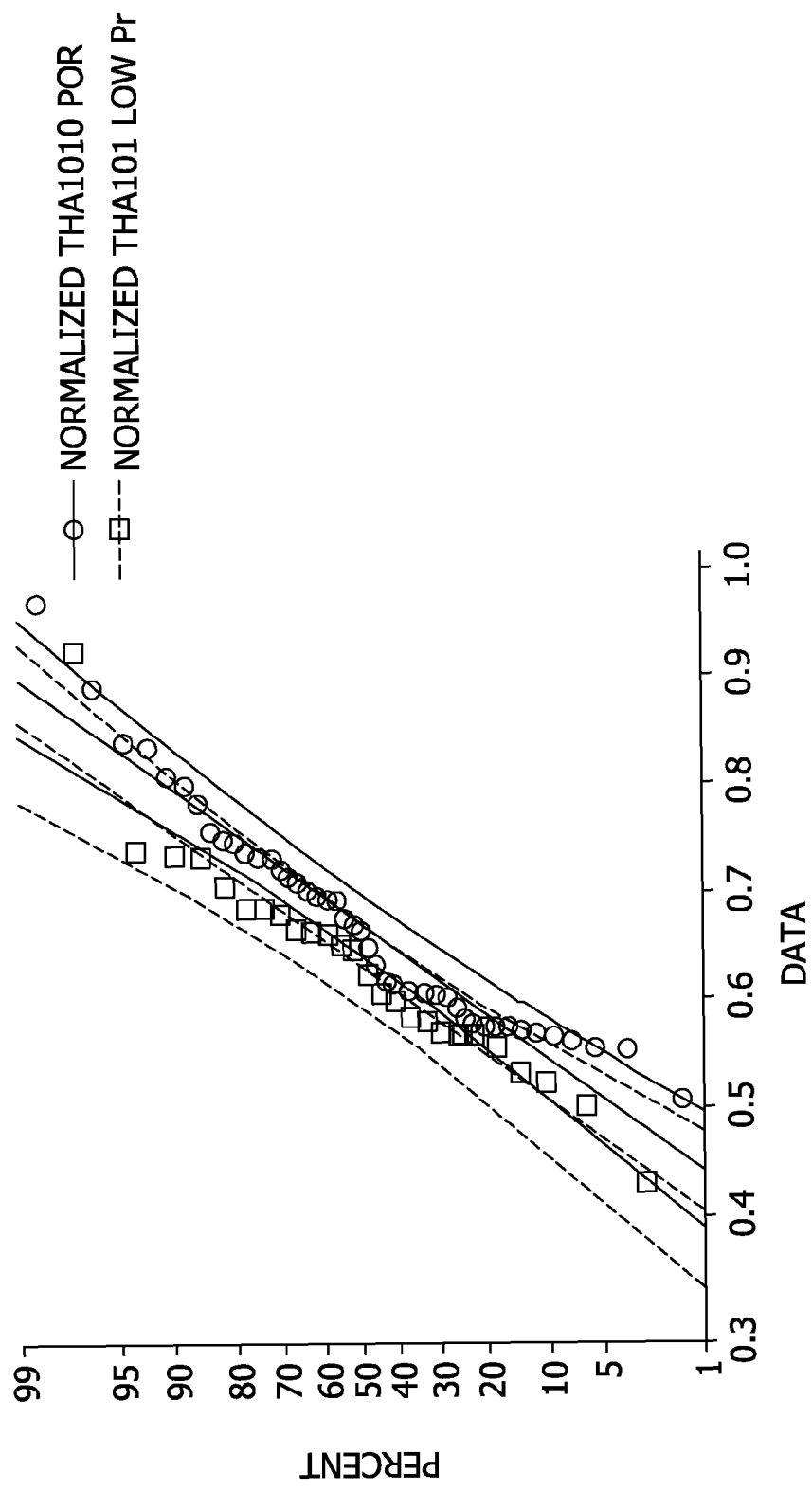
FIG. 31 is a graph depicting the normalized distribution of threshold height area measurements on the surface of a wafer for a previous grinding process and the process described in FIG. 29.

FIG. 31 is a graph depicting the normalized distribution of the THA1010 measurements for both data sets. The first data set is referred to as Normalized THA1010 POR and the second data set is referred to as Normalized THA1010 Low Pr. The measurements for each data set were normalized (i.e., divided by a common divisor). The y-coordinate of each one of the data points on the graph indicates the percentage of the measurements which are equal to or less than the x-coordinate of the respective data point. Moreover, solid lines indicate the bounds of a 95% confidence interval for the first data set. Dashed lines indicate the bounds of a 95% confidence interval for the second data set.

Figure 32:
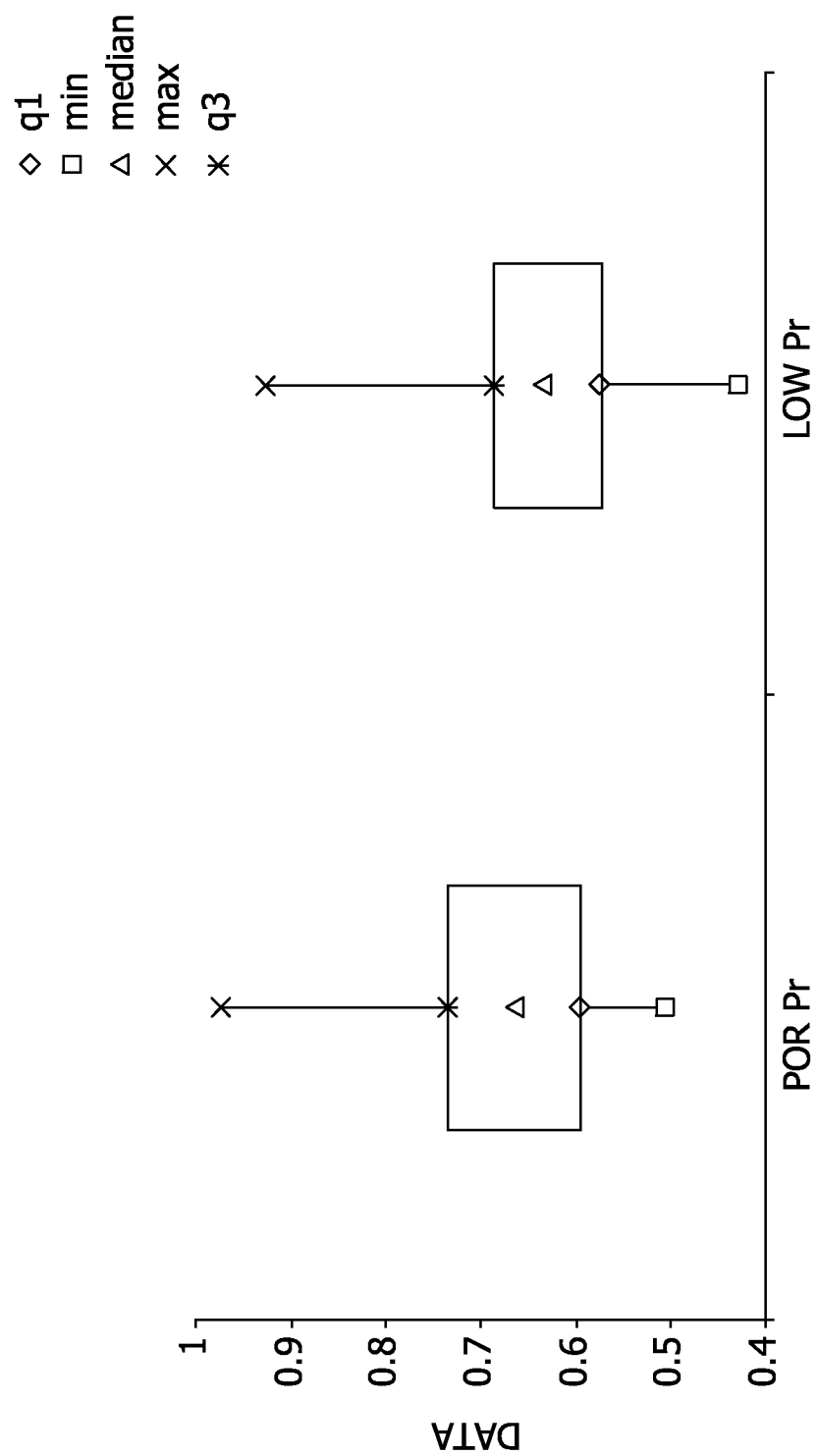
FIG. 32 is a box plot chart depicting the normalized threshold height area measurements on the surface of a wafer for a previous grinding process and the process described in FIG. 29.

FIG. 32 is a box plot chart depicting the normalized threshold height area measurements on the surface of the tested wafers. The chart depicts box plots of the two data sets of FIG. 31 and for each data set the chart shows the respective minimum, first quartile, median, third quartile, and maximum.

FIGS. 31 and 32 thus show that surfaces of wafers ground according to the embodiment of FIG. 29 have significantly lower peak to valley measurements than those ground according to the POR. The surfaces of the wafers ground according to the embodiment of FIG. 29 thus have improved nanotopology compared to the surfaces of wafers ground according to the POR. For example, wafers ground in accordance with the process of FIG. 29 have a normalized mean THA1010 of 0.6346, while those ground according to the POR have a normalized mean THA1010 of 0.6738. The standard deviation is likewise reduced for the wafers ground in accordance with FIG. 29 (std. dev.=0.09826) compared to those ground according to the POR (std. dev.=0.09956).

Moreover, the box plot chart of FIG. 32 shows that the normalized peak to valley measurements of wafers ground in accordance with FIG. 29 are distributed within a narrower range compared to those of the POR. As clearly shown, the first and third quartiles of the second data set (i.e., Low Pr) are more closely spaced than those of the first data set (i.e., POR Pr). Moreover, the max and min of the second data set have lower values than the max and min of the first data set.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method of processing a semiconductor wafer using a double side grinder of the type that holds the wafer between a pair of grinding wheels and a pair of hydrostatic pads during a grinding operation, the method comprising:
    establishing a first hydrostatic pressure in the hydrostatic pads to initially clamp the wafer during a first stage of the grinding operation,
    measuring the amount of electrical current used by the grinding wheels of the double side grinder,
    determining the stage of the grinding operation based on the measured amount of electrical current used by the grinding wheels of the double side grinder,
    reducing the hydrostatic pressure to a second hydrostatic pressure lower than the first pressure during grinding of the wafer in a second stage of the grinding operation, and
    increasing the hydrostatic pressure to a third hydrostatic pressure during a third stage of the grinding operation to clamp the wafer and to thereby improve nanotopology in the processed wafer.

2. The method of claim 1 wherein the third hydrostatic pressure is substantially equal to the first hydrostatic pressure.

3. The method of claim 1 wherein the wafer is substantially clamped by the grinding wheels during grinding of the wafer.

4. The method of claim 1 wherein the hydrostatic pressure is changed by use of flow control valves.

5. The method of claim 1 wherein the wafer is held in a substantially vertical plane.

6. The method of claim 1 further comprising determining the stage of the grinding operation is the first stage when the measured electrical current increases to an initial state from a residual state.

7. The method of claim 1 further comprising determining the stage of the grinding operation is the second stage when the measured electrical current is at its peak level.

8. The method of claim 7 further comprising determining the stage of the grinding operation is the third stage when the measured electrical current decreases from its peak level.

9. A double side grinder comprising a pair of grinding wheels, a processor, a pair of hydrostatic pads, and flow control valves, the grinding wheels and hydrostatic pads being operable to hold a generally flat wafer in a plane with a first part of the wafer positioned between the grinding wheels and a second part of the wafer positioned between the hydrostatic pads, the processor being operable to measure the amount of electrical current used by the grinding wheels, the hydrostatic pads including water flowing therethrough to maintain a hydrostatic pressure, the flow control valves operable to controll the water flow rate through the pads and to thereby control the hydrostatic pressure, the processor including pattern detection software for detecting various stages of a grinding process based on the measured amount of electrical current used by the grinding wheels, the processor operable to control water flow rate through the flow control valves in response to the stage detected by the pattern detection software.

10. The grinder of claim 9 wherein the processor controls the flow control valves to increase the water flow rate through the valves when the pattern detection software detects a grinding stage of the grinding process.

* * * * *